(12) United States Patent  
Umemura et al.

(10) Patent No.: US 8,598,902 B2  
(45) Date of Patent: Dec. 3, 2013

(54) PROBE, ELECTRONIC DEVICE TEST APPARATUS, AND METHOD OF PRODUCING THE SAME

(75) Inventors: Yoshiharu Umemura, Tokyo (JP); Kensuke Kato, Tokyo (JP); Yoshirou Nakata, Tokyo (JP); Naomi Miyake, Osaka (JP)

(73) Assignees: Advantest Corporation, Tokyo (JP); Panasonic Corporation, Osaka (JP)

( * ) Notice: Subject to any disclaimer, the term of this patent is extended or adjusted under 35 U.S.C. 154(b) by 342 days.

(21) Appl. No.: 12/994,579

(22) PCT Filed: May 12, 2009

(86) PCT No.: PCT/JP2009/058825  
§ 371 (c)(1),  
(2), (4) Date: Jan. 28, 2011

(87) PCT Pub. No.: WO2009/147929  
PCT Pub. Date: Dec. 10, 2009

(65) Prior Publication Data  
US 2011/0121847 A1 May 26, 2011

(30) Foreign Application Priority Data  
Jun. 2, 2008 (JP) .................... 2008-144772

(51) Int. Cl.  
*G01R 31/20* (2006.01)

(52) U.S. Cl.  
USPC ................. 324/754.11; 324/754.03

(58) Field of Classification Search  
USPC .................................. 324/754.11  
See application file for complete search history.

(56) References Cited

U.S. PATENT DOCUMENTS

| | | | |
|---|---|---|---|
| 6,215,321 B1 | 4/2001 | Nakata | |
| 6,791,347 B2* | 9/2004 | Ishizaka et al. | 324/750.05 |
| 2002/0109514 A1* | 8/2002 | Brandorff et al. | 324/754 |
| 2004/0012405 A1 | 1/2004 | Cheng et al. | |
| 2004/0080329 A1* | 4/2004 | Jain | 324/765 |
| 2004/0145382 A1 | 7/2004 | Kohno et al. | |
| 2007/0178727 A1* | 8/2007 | Igarashi et al. | 439/91 |
| 2010/0176396 A1 | 7/2010 | Wada | |
| 2010/0176829 A1 | 7/2010 | Wada | |

FOREIGN PATENT DOCUMENTS

| | | |
|---|---|---|
| JP | 9-92365 A | 4/1997 |
| JP | 9-133710 A | 5/1997 |

(Continued)

OTHER PUBLICATIONS

Taiwan Office action, mail date is Apr. 2, 2013.

*Primary Examiner* — Jermele M Hollington  
*Assistant Examiner* — Christopher McAndrew  
(74) *Attorney, Agent, or Firm* — Greenblum & Bernstin P.L.C.

(57) ABSTRACT

A probe comprises: a membrane having a bump which contacts an input/output terminal of an IC device built into a semiconductor wafer under test; a pitch conversion board having a bottom surface on which a first terminal is provided and a top surface on which a second terminal connected to the first terminal is provided; a circuit board which is electrically connected to a test head and has a third terminal; a first anisotropic conductive rubber member having a first conductor part which electrically connects the bump of the membrane and the first terminal of the pitch conversion board; and a second anisotropic conductive rubber member having a second conductor part which electrically connects the second terminal of the pitch conversion board and the third terminal of the circuit board, and the second conductor parts are provided on the whole of the second anisotropic conductive rubber member.

28 Claims, 26 Drawing Sheets

(56) References Cited

FOREIGN PATENT DOCUMENTS

| | | |
|---|---|---|
| JP | 2003-7782 A | 1/2003 |
| JP | 2004-53409 A | 2/2004 |
| JP | 2006-38874 A | 2/2006 |
| JP | 2007-3334 A | 1/2007 |
| JP | 2007-71699 A | 3/2007 |
| JP | 2008-39768 A | 2/2008 |
| JP | 2008-89461 A | 4/2008 |
| TW | 200624817 | 7/2006 |
| TW | 200702672 | 1/2007 |

* cited by examiner

[AT ROOM TEMPERATURE]

[AT ROOM TEMPERATURE]

[AT TEST TEMPERATURE]

[AT ROOM TEMPERATURE]

X-DIRECTION

[AT TEST TEMPERATURE]

[AT ROOM TEMPERATURE]

[AT TEST TEMPERATURE]

US 8,598,902 B2

PROBE, ELECTRONIC DEVICE TEST APPARATUS, AND METHOD OF PRODUCING THE SAME

TECHNICAL FIELD

The present invention relates to a probe for establishing electrical connection between a test apparatus main body and an IC device in an electronic device test apparatus for testing electrical characteristics of integrated circuit devices and other various types of electronic devices (hereinafter also referred to representatively as "IC devices") built into a semiconductor wafer under test, an electronic device test apparatus comprising the same, and a method of production of the probe.

BACKGROUND ART

A large number of semiconductor integrated circuit devices are built into a silicon wafer or other semiconductor wafer, then are diced, wire bonded, packaged, and otherwise processed to form completed electronic devices. Such IC devices are tested for operation before shipment. The operating tests are run in the wafer state or state of the completed devices.

As the probes used for testing IC devices in the wafer state, known in the past have been ones which comprise first and second anisotropic conductive rubber members are respectively interposed between a membrane and first and second boards so as to increase the number of IC devices which can be simultaneously tested (see, for example, PLT 1).

The first and second anisotropic conductive rubber members of this probe have first and second conductor parts for electrically connecting the membrane and the first board and second board. In a test using this probe, when bumps provided on the membrane contact the input/output terminals of the IC devices, the bumps are pushed up and the first and second conductor parts are compressed, whereby the membrane and the first and second boards are electrically connected. In this state, the test apparatus main body (hereinafter also referred to as the "tester") of the electronic device test apparatus inputs test signals to the IC devices and receives output from the same so as to test the IC devices.

However, in the above probe, the second conductor parts are unevenly distributed at the peripheral edges of the second anisotropic conductive rubber member. Therefore, when a semiconductor wafer under test is pushed against the probe, the pushing force is applied to only the peripheral edges of the first board, so the first board is warped, the first anisotropic conductive rubber member is not evenly pressed, and poor electrical contact is liable to occur at the center part of the first anisotropic conductive rubber member.

CITATION LIST

Patent Literature

PLT 1: Japanese Patent Publication (A) No. 2004-53409

SUMMARY OF INVENTION

Technical Problem

The problem to be solved by the present invention is the provision of a probe which can suppress the occurrence of poor electrical contact, an electronic device test apparatus comprising with the same, and a method of production of the probe.

Solution to Problem

To solve the above problem, according to a first aspect of the present invention, there is provided a probe for establishing electrical connection between an electronic device under test formed on a semiconductor wafer under test and an electronic device test apparatus for testing the electronic device under test, the probe characterized by comprising: a membrane having a contact terminal for contacting an input/output terminal of the electronic device under test; a first board having a first main surface on which a first terminal is provided and a second main surface on which a second terminal electrically connected to the first terminal is provided; a second board which is electrically connected to the electronic device test apparatus and has a third terminal; a first anisotropic conductivity elastic member having a first conductor part which electrically connects the contact terminal of the membrane and the first terminal of the first board; and a second anisotropic conductivity elastic member having a second conductor part which electrically connects the second terminal of the first board and the third terminal of the second board, wherein the second conductor parts are arranged on the whole of the second anisotropic conductivity elastic member (see claim 1).

While not particularly limited to this in the above invention, preferably conductor groups each of which has at least one of the second conductor parts are arranged on the whole of the second anisotropic conductivity elastic member so as to substantially evenly disperse (see claim 2).

While not particularly limited to this in the above invention, preferably a plurality of the second conductor parts are arranged so as to substantially evenly disperse in each of the conductor groups (see claim 3).

While not particularly limited to this in the above invention, preferably the first board is a rigid board (see claim 4).

While not particularly limited to this in the above invention, preferably the first terminal is arranged so as to correspond to the input/output terminal provided on the semiconductor wafer under test or the contact terminal of the membrane, and the second terminal is arranged so as to correspond to the third terminal of the second board (see claim 5).

While not particularly limited to this in the above invention, preferably the first board is divided into a plurality of sections (see claim 6).

While not particularly limited to this in the above invention, preferably, when the second board is applied with pressure, the first board is substantially evenly pressed through each of the second conductor parts of the second anisotropic conductivity elastic member (see claim 7).

While not particularly limited to this in the above invention, preferably the second terminals are arranged at a broader pitch than the first terminals or are formed larger than the first terminals (see claim 8).

While not particularly limited to this in the above invention, preferably the probe satisfies the following formula (1) (see claim 9).

$$\alpha \leq \gamma \leq \epsilon \qquad (1)$$

where, in the formula (1), $\alpha$ is a coefficient of thermal expansion of the semiconductor wafer under test, $\gamma$ is a coefficient of thermal expansion of the first board, and $\epsilon$ is a coefficient of thermal expansion of the second board.

While not particularly limited to this in the above invention, preferably the probe satisfies the following formula (2) (see claim 10).

$$\alpha \leq \beta \leq \gamma \tag{2}$$

where, in the above formula (2), $\alpha$ is a coefficient of thermal expansion of the semiconductor wafer under test, $\beta$ is a thermal expansion rate of the first anisotropic conductivity elastic member, and $\gamma$ is a coefficient of thermal expansion of the first board.

While not particularly limited to this in the above invention, preferably the first anisotropic conductivity elastic member has a first holding means for holding the first conductor part, the first conductor part has conductivity in only a thickness direction, and a coefficient of thermal expansion of the first holding means is set so that a thermal expansion rate of the first anisotropic conductivity elastic member satisfies the formula (2) (see claim 11).

While not particularly limited to this in the above invention, preferably the probe satisfies the following formula (3) (see claim 12).

$$\gamma \leq \delta < \epsilon \tag{3}$$

where, in the above formula (3), $\gamma$ is a coefficient of thermal expansion of the first board, $\delta$ is a thermal expansion rate of the second anisotropic conductivity elastic member, and $\epsilon$ is a coefficient of thermal expansion of the second board.

While not particularly limited to this in the above invention, preferably the second anisotropic conductivity elastic member has a second holding means for holding the second conductor part, the second conductor part has conductivity in only a thickness direction, and a coefficient of thermal expansion of the second holding means is set so that a thermal expansion rate of the second anisotropic conductivity elastic member satisfies the formula (3) (see claim 13).

While not particularly limited to this in the above invention, preferably the probe satisfies the following formulas (4) and (5) (see claim 14).

$$(L_{x1}+L_{x2})/2 > |(\delta \times D_2 \cos \theta_2 - \gamma \times D_1 \cos \theta_1) \times \Delta T| \tag{4}$$

$$(L_{y1}+L_{y2})/2 > |(\delta \times D_2 \sin \theta_2 - \gamma \times D_1 \sin \theta_1) \times \Delta T| \tag{5}$$

where, in the above formulas (4) and (5), $\gamma$ is a coefficient of thermal expansion of the first board, $\delta$ is a thermal expansion rate of the second anisotropic conductivity elastic member, $D_1$ is a distance from a center of gravity of the first board to the second terminal, $D_2$ is a distance from a center of gravity of the second anisotropic conductivity elastic member to the second conductor part, $\theta_1$ is an angle of an imaginary line connecting from a center of gravity of the first board to the second terminal with respect to an X-axis, $\theta_2$ is an angle of an imaginary line connecting from a center of gravity of the second anisotropic conductivity elastic member to the second conductor part with respect to the X-axis, $L_{x1}$ is a length of the second terminal in the X-axial direction, $L_{x2}$ is a length of the second conductor part in the X-axial direction, $L_{y1}$ is a length of the second terminal in a Y-axial direction substantially perpendicular to the X-axis, $L_{y2}$ is a length of the second conductor part in the Y-axial direction, and $\Delta T$ is a temperature difference between a test temperature and a room temperature.

While not particularly limited to this in the above invention, preferably the probe satisfies the following formulas (6) and (7) (see claim 15).

$$(L_{x2}+L_{x3})/2 > |(\epsilon \times D_3 \cos \theta_3 - \delta \times D_2 \cos \theta_2) \times \Delta T| \tag{6}$$

$$(L_{y2}+L_{y3})/2 > |(\epsilon \times D_3 \sin \theta_3 - \delta \times D_2 \sin \theta_2) \times \Delta T| \tag{7}$$

where, in the above formulas (6) and (7), $\delta$ is a thermal expansion rate of the second anisotropic conductivity elastic member, $\epsilon$ is a coefficient of thermal expansion of the second board, $D_2$ is a distance from a center of gravity of the second anisotropic conductivity elastic member to the second conductor part, $D_3$ is a distance from a center of gravity of the second board to the third conductor part, $\theta_2$ is an angle of an imaginary line connecting from a center of gravity of the second anisotropic conductivity elastic member to the second conductor part with respect to an X-axis, $\theta_3$ is an angle of an imaginary line connecting from a center of gravity of the second board to the third terminal with respect to the X-axis, $L_{x2}$ is a length of the second conductor part in the X-axial direction, $L_{x3}$ is a length of the third conductor part in the X-axial direction, $L_{y2}$ is a length of the second conductor part in a Y-axial direction substantially perpendicular to the X-axis, $L_{y3}$ is a length of the third conductor part in the Y-axial direction, and $\Delta T$ is a temperature difference between a test temperature and a room temperature.

While not particularly limited to this in the above invention, preferably the probe satisfies the following formulas (8) and (9) (see claim 16).

$$L_{x2} > |(\epsilon \times D_3 \cos \theta_3 - \gamma \times D_1 \cos \theta_1) \times \Delta T| \tag{8}$$

$$L_{y2} > |(\epsilon \times D_3 \sin \theta_3 - \gamma \times D_1 \sin \theta_1) \times \Delta T| \tag{9}$$

where, in the above formula (8) and formula (9), $\gamma$ is a coefficient of thermal expansion of the first board, $\epsilon$ is a coefficient of thermal expansion of the second board, $D_1$ is a distance from a center of gravity of the first board to the second terminal, $D_3$ is a distance from a center of gravity of the second board to the third conductor parts, $\theta_1$ is an angle of an imaginary line connecting from a center of gravity of the first board to the second terminal with respect to an X-axis, $\theta_3$ is an angle from a center of gravity of the second board to the third terminal with respect to the X-axis, $L_{x2}$ is a length of the second conductor part in the X-axial direction, $L_{y2}$ is a length of the second conductor part in a Y-axial direction substantially perpendicular to the X-axis, and $\Delta T$ is a temperature difference between a test temperature and a room temperature.

While not particularly limited to this in the above invention, preferably the first conductor part has conductivity in only a thickness direction, and the probe satisfies the following formula (10) (see claim 17).

$$(\gamma-\alpha) \times \Delta T \times D_4 \leq 0.2 \times t_1 \tag{10}$$

where, in the above formula (10), $\alpha$ is a coefficient of thermal expansion of the semiconductor wafer under test, $\gamma$ is a coefficient of thermal expansion of the first board, $\Delta T$ is a temperature difference between a test temperature and a room temperature, $D_4$ is a distance from a center of gravity of the first board to the first terminal at a most distant position, and $t_1$ is a thickness of the first conductor part.

While not particularly limited to this in the above invention, preferably the second conductor part has conductivity in only a thickness direction, and the probe satisfies the following formula (11) (see claim 18).

$$(\epsilon-\gamma) \times \Delta T \times D_5 \leq 0.2 \times t_2 \tag{11}$$

where, in the above formula (11), $\gamma$ is a coefficient of thermal expansion of the first board, $\epsilon$ is a coefficient of thermal expansion of the second board, $\Delta T$ is a temperature difference between a test temperature and a room temperature, $D_5$ is a distance from a center of gravity of the first board to the second terminal at a most distant position, and $t_2$ is a thickness of the second conductor part.

While not particularly limited to this in the above invention, preferably the second board has an electronic device which is used at the time of the test and is mounted on the surface opposite to the surface facing the second anisotropic conductivity elastic member (see claim 19).

While not particularly limited to this in the above invention, preferably the first board is provided with two or more positioning-use first through holes (see claim 20).

While not particularly limited to this in the above invention, preferably the third terminal is arranged so as to correspond to the second terminal, the second board has a positioning-use first mark arranged so as to correspond to the first through hole of the first board, and the first mark is formed at the same step as the third terminal (see claim 21).

While not particularly limited to this in the above invention, preferably the second anisotropic conductivity elastic member is provided with a positioning-use second through hole so as to correspond to the first through hole of the first board (see claim 22).

While not particularly limited to this in the above invention, preferably the membrane is provided with a positioning-use second mark so as to correspond to the first through hole of the first board, and the second mark is formed at the same step as the conductive pattern provided on the surface of the membrane facing the first anisotropic conductivity elastic member (see claim 23).

While not particularly limited to this in the above invention, preferably the first anisotropic conductivity elastic member is provided with a positioning-use third through hole so as to correspond to the first through hole of the first board (see claim 24).

While not particularly limited to this in the above invention, preferably the probe further comprises a sealing member provided between the membrane and the second board so as to cover the first anisotropic conductivity elastic member, the first board, and the second anisotropic conductivity elastic member at the outer circumference (see claim 25).

While not particularly limited to this in the above invention, preferably the sealing member has the substantially same height as the height from the membrane to the second board, and the sealing member holds the membrane flatly (see claim 26).

To solve the above problem, according to a second aspect of the present invention, there is provided an electronic device test apparatus characterized by comprising: the above probe; a holding means for holding the semiconductor wafer under test so as to face the probe; a sealing means for forming a sealed space between the second board of the probe and the holding means; and a pressure reducing means for reducing a pressure in the sealed space, wherein the pressure reducing means reduces pressure in the sealed space so that the contact terminal of the membrane is connected to the third terminal of the second board through the first anisotropic conductivity elastic member, the first board, and the second anisotropic conductivity elastic member and so that the contact terminal of the membrane and the input/output terminal formed on the semiconductor wafer under test contact (see claim 27).

To solve the above problem, according to a third aspect of the present invention, there is provided a method of production of the above probe characterized by comprising: a first positioning step of aligning a second through hole provided in the second anisotropic conductivity elastic member with a first mark provided on the second board so as to position the second anisotropic conductivity elastic member with respect to the second board; a first stacking step of stacking the second anisotropic conductivity elastic member on the second board; a second positioning step of aligning a first through hole provided in the first board with the first mark so as to position the first board with respect to the second board; and a second stacking step of stacking the first board on the second anisotropic conductivity elastic member (see claim 28).

To solve the above problem, according to a fourth aspect of the present invention, there is provided a method of production of the above probe characterized by comprising: a first positioning step of aligning a third through hole provided in the first anisotropic conductivity elastic member with a second mark provided on the membrane so as to position the first anisotropic conductivity elastic member with respect to the membrane; a first stacking step of stacking the first anisotropic conductivity elastic member on the membrane; a second positioning step of aligning a first through hole provided in the first board with the second mark so as to position the first board with respect to the membrane; and a second stacking step of stacking the first board on the first anisotropic conductivity elastic member.

Advantageous Effects of Invention

In the present invention, the second conductor parts are provided on the whole of the second anisotropic conductivity elastic member. Due to this, the first board is resistant to warping and the first anisotropic conductivity elastic member can be applied with pressure substantially evenly, so occurrence of poor electrical contact can be suppressed.

EMBODIMENTS OF INVENTION

Figure 1:
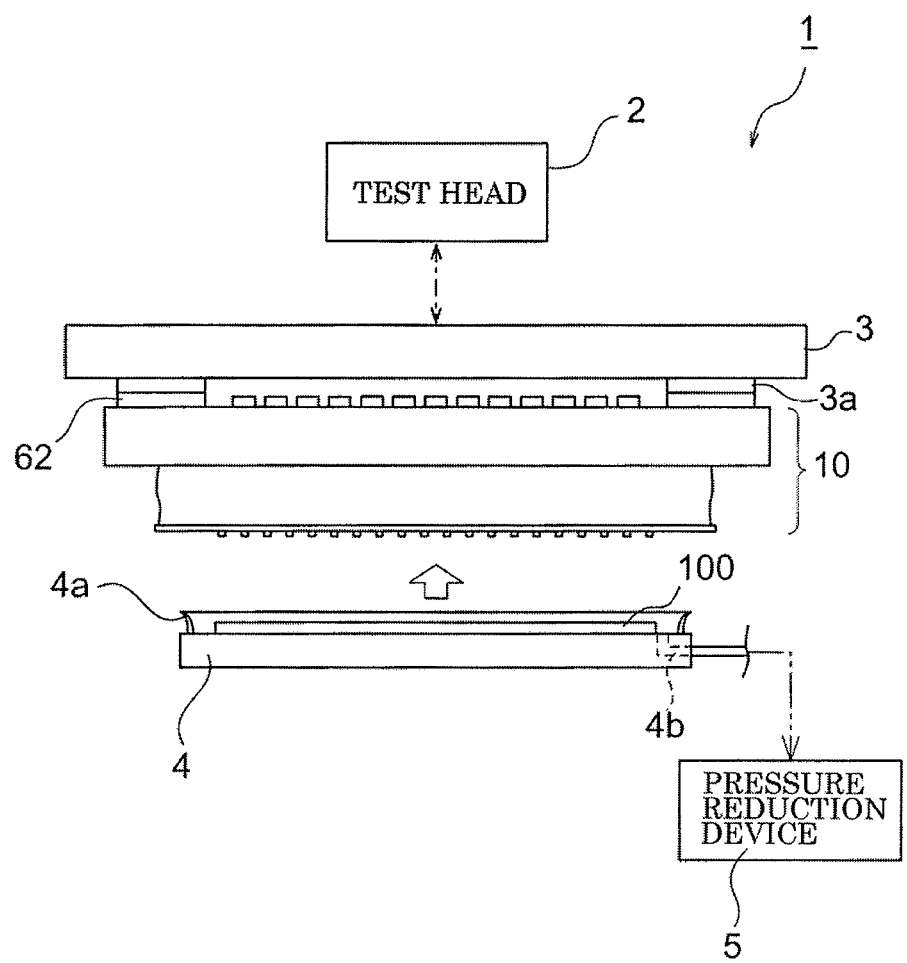
FIG. 1 is a schematic view of an electronic device test apparatus in an embodiment of the present invention.

Below, an embodiment of the present invention will be explained based on the drawings. FIG. 1 is a schematic view showing an electronic device test apparatus in the present embodiment.

An electronic device test apparatus 1 in the present embodiment, as shown in FIG. 1, comprises a test head 2, a wafer mother board 3, a probe 10 (probe card), a wafer tray 4, and a pressure reduction device 5. At the time of testing IC devices, a semiconductor wafer under test 100 held on the wafer tray 4 is made to face the probe 10. In this state, the inside of a sealed space 80 (see FIG. 15) is reduced in pressure by the pressure reduction device 5. Due to this, the semiconductor wafer under test 100 is pushed against the probe 10 and electrical connection between component elements of the probe 10 is secured. Further, in this state, a tester (not shown) connected to the test head 2 inputs and receives test signals to and from IC devices built in the semiconductor wafer under test 100 so as to test the IC devices.

Figure 2:
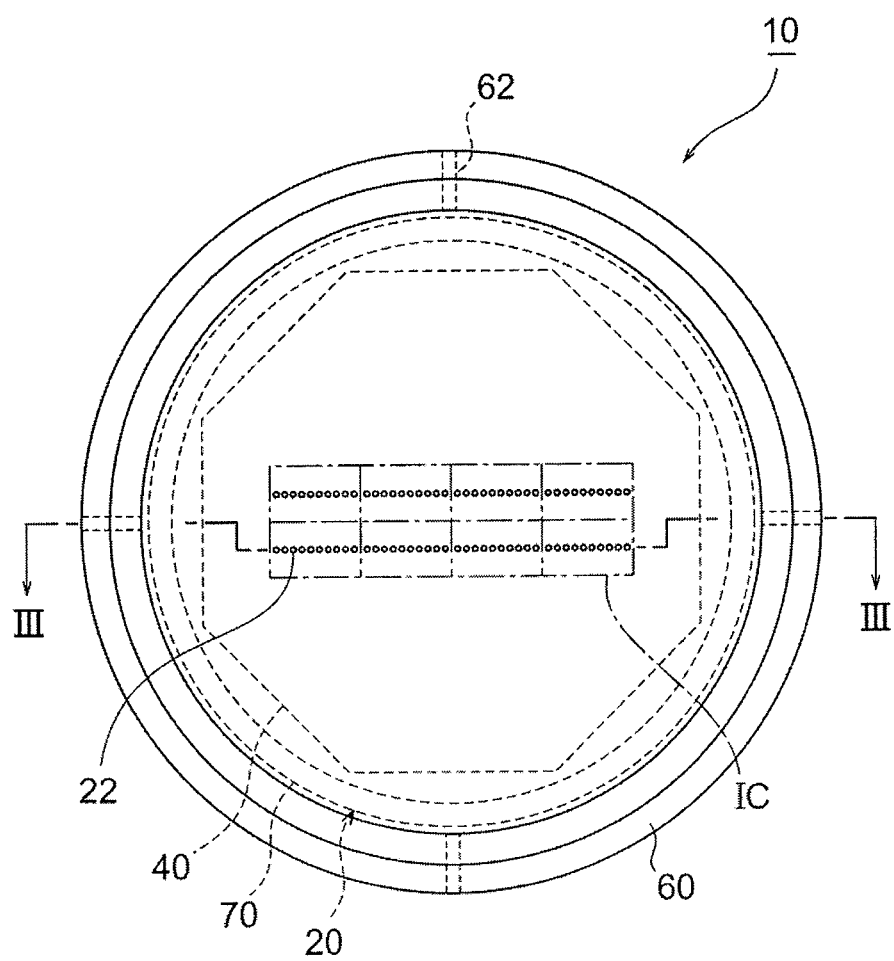
FIG. 2 is a plan view of a probe in an embodiment of the present invention as seen from the bottom side.
Figure 3:
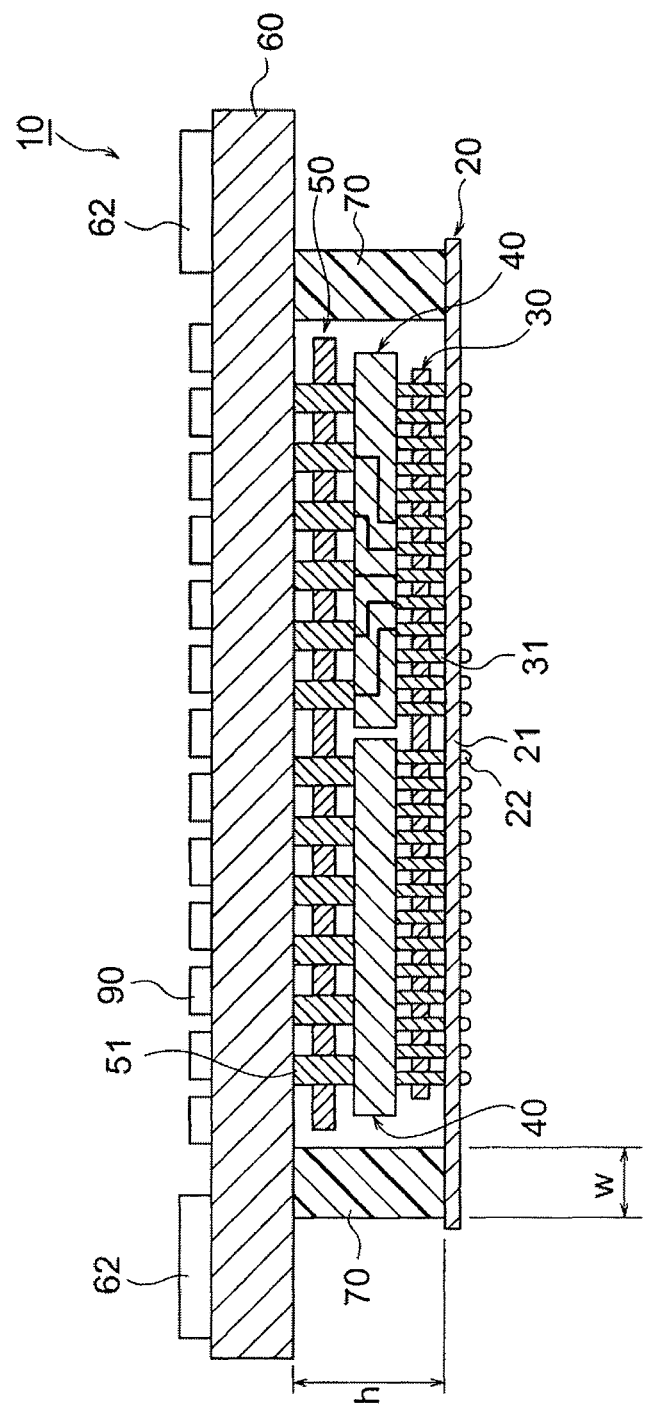
FIG. 3 is a cross-sectional view along the line III-III of FIG. 2.
Figure 4:
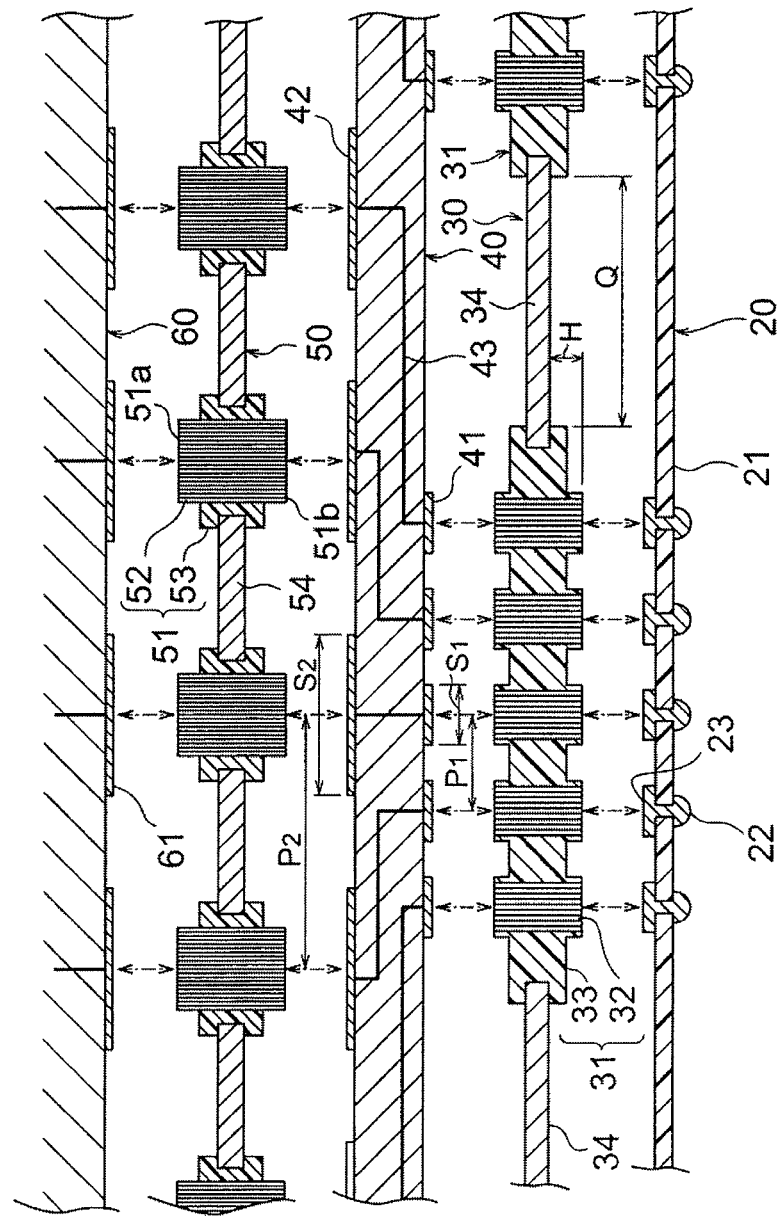
FIG. 4 is a disassembled cross-sectional view of a probe in an embodiment of the present invention.

FIG. 2 is a plan view of the probe in the present embodiment as seen from the bottom side, FIG. 3 is a cross-sectional view along the line III-III of FIG. 2, and FIG. 4 is a disassembled cross-sectional view of a probe.

The probe 10 in the present embodiment, as shown in FIG. 2 to FIG. 4, comprises: a membrane 20 having bumps 22 which electrically contact input/output terminals 110 of the IC devices (see FIG. 16); a circuit board 60 (a second board) which is electrically connected to the tester through the test head 2; a pitch conversion board 40 (a first board) which converts a pitch of terminals between the membrane 20 and the circuit board 60; a first anisotropic conductive rubber member 30 (a first anisotropic conductivity conductor) which electrically connects the membrane 20 and the pitch conversion board 40; and a second anisotropic conductive rubber member 50 (a second anisotropic conductivity conductor) which electrically connects the pitch conversion board 40 and the circuit board 60. The membrane 20, a first anisotropic conductive rubber member 30, a pitch conversion board 40, a second anisotropic conductive rubber member 50, and a circuit board 60 are stacked in that order.

The membrane 20, as shown in FIG. 2 and FIG. 4, comprise a sheet-shaped member 21 with pliability, a sheet-shaped member 21 has the bottom surface (surface facing semiconductor wafer under test 100) on which bumps 22 (contact terminals) are provided and the top surface (surface facing first anisotropic conductive rubber member 30) on which conductive patterns 23 are provided. As the material of which the sheet-shaped member 21 is made, for example, a polyimide or aramid fiber etc. may be mentioned. A coefficient of thermal expansion of a semiconductor wafer under test 100 is about 3.5 ppm/° C., while a coefficient of thermal expansion of this membrane 20 is substantially the same as that of the semiconductor wafer under test 100.

The bumps 22 are, for example, made of nickel or another conductive material and have protruding shapes which project out to below the sheet-shaped member 21. The bumps 22 are arranged on the bottom surface of the sheet-shaped member 21 so as to correspond to the input/output terminals 110 of the semiconductor wafer under test 100 (see FIG. 16). For example, in FIG. 2, the example is shown of a membrane 20 in the case of simultaneously testing eight IC devices (shown by dot-chain lines in the figure) on the wafer 100. The bumps 22, for example, are formed by using a laser to form through holes in the sheet-shaped member 21 and by growing nickel in them by plating. Note that, they may also be roughened so as to easily break any oxide film formed on the input/output terminals 110 of the IC devices at the time of a test. Further, when the input/output terminals of the semiconductor wafer under test are formed in protruding shapes, the contact terminals of the membrane may also be formed flat.

The conductive patterns 23, for example, are formed to the desired thickness by plating or printing the top surface of the sheet-shaped member 21 with copper and then etching. The conductive patterns 23 are arranged so as to correspond to the bumps 22. The bumps 22 and the conductive patterns 23 are electrically connected.

Figure 5:
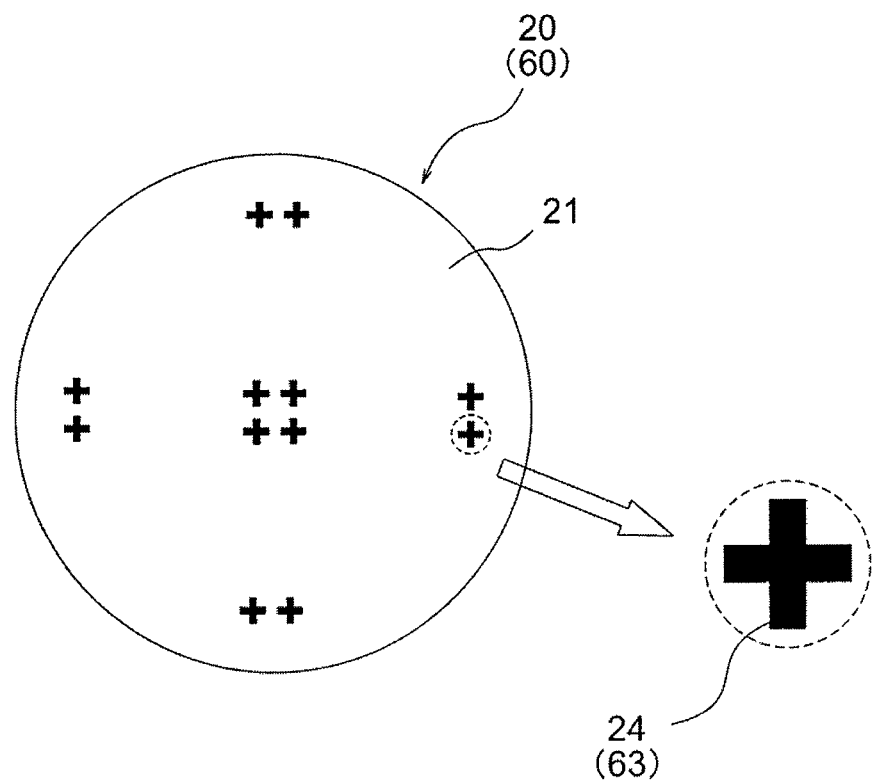
FIG. 5 is a schematic plan view of a membrane and circuit board of a probe in an embodiment of the present invention.

FIG. 5 is a schematic plan view of the membrane and the circuit board of a probe in an embodiment of the present invention. As shown in FIG. 5, cross-shaped alignment marks 24 are provided on the top surface of the sheet-shaped member 21 for high precision positioning of the component members 20 to 60 at the time of assembling the probe 10. The alignment marks 24 are formed at the same step as the step of forming the conductive patterns 23 on the top surface of the sheet-shaped member 21 and are arranged to correspond to first through holes 44 (explained later) provided on the pitch circuit board 40. Note that, the shape of the alignment marks 24 is not limited to a cross shape. Any shape can be employed.

The first anisotropic conductive rubber member 30, as shown in FIG. 3 and FIG. 4, comprises first conductor parts 31 having conductivity in only a thickness direction and a first frame 34 holding the first conductor parts 31. This first anisotropic conductive rubber member 30 has an about 5 to 6 ppm/° C. thermal expansion rate.

Each of the first conductor parts 31 comprises: a particle dispersion part 32 having conductive particles which are arranged in an insulator so as to locally disperse; and an insulating part 33 positioned around the particle dispersion part 32 and formed from only an insulator. In the particle dispersion part 32, when that part 32 is compressed in the thickness direction, the conductive particles adjoining in the thickness direction come in contact with each other, whereby conduction in only the thickness direction can be achieved. Further, the particle dispersion parts 32 are arranged so as to correspond to the conductive patterns 23 of the membrane 20. As the conductive particles of which the particle dispersion parts 32 are made, for example, iron, copper, zinc, chrome, nickel, silver, aluminum, or alloys of the same etc. may be mentioned. Further, as the insulator forming the particle dispersion parts 32 and insulating parts 33, for example, silicone rubber, urethane rubber, natural rubber, or other insulating materials having elasticity may be mentioned.

In the present embodiment, the metal material forming the first frame 34 is selected so that the thermal expansion rate of the first anisotropic conductive rubber member 30 becomes between a coefficient of thermal expansion of the semiconductor wafer under test 100 and a coefficient of thermal expansion of the pitch conversion board 40. Specifically, 42Alloy is used to form the first frame 34. Note that, the material forming the first frame 34 is not particularly limited to this, but, for example, iron, copper, nickel, chrome, cobalt, magnesium, manganese, molybdenum, indium, lead, palladium, titanium, tungsten, aluminum, gold, platinum, silver or alloys of the same etc. may be used.

Figure 6:
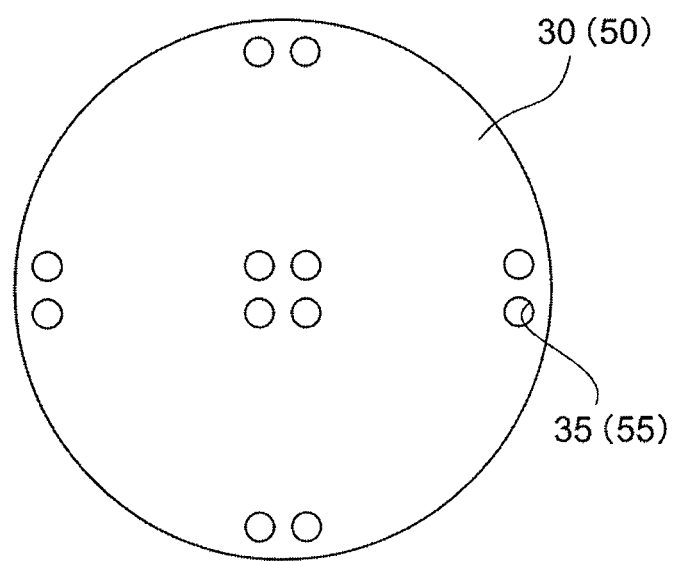
FIG. 6 is a schematic plan view of first and second anisotropic conductive rubber members of a probe in an embodiment of the present invention.

FIG. 6 is a schematic plan view of the first and second anisotropic conductive rubber members of the probe in the present embodiment. As shown in FIG. 6, the first anisotropic conductive rubber member 30 is formed with alignment-use third through holes 35 so as to correspond to first through holes 44 (explained later) provided in the pitch conversion board 40 in order to enable high precision positioning of the component members 20 to 60 with each other when assembly the probe 10.

Figure 7:
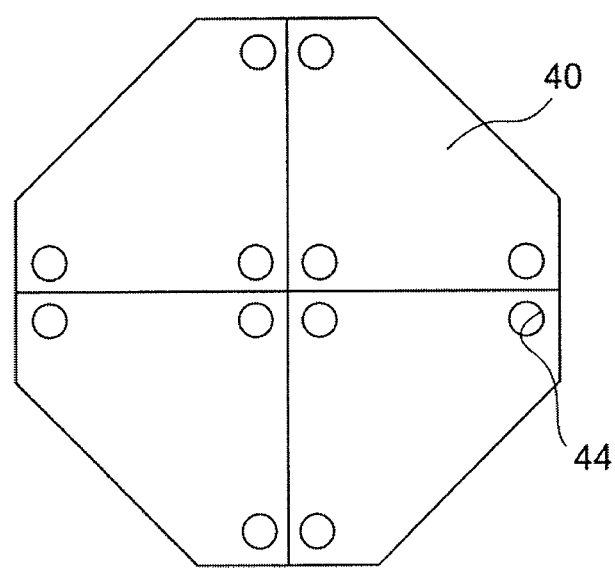
FIG. 7 is a schematic plan view of a pitch conversion board of a probe in an embodiment of the present invention.
Figure 8A:
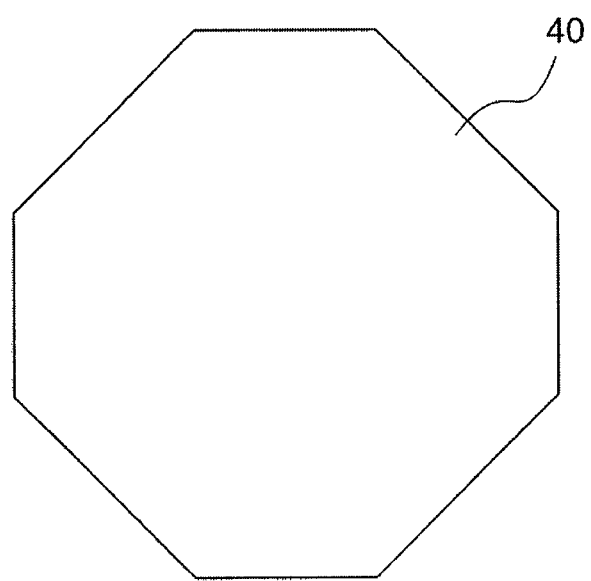
FIG. 8A is a schematic plan view of a pitch conversion board in another embodiment of the present invention.
Figure 8B:
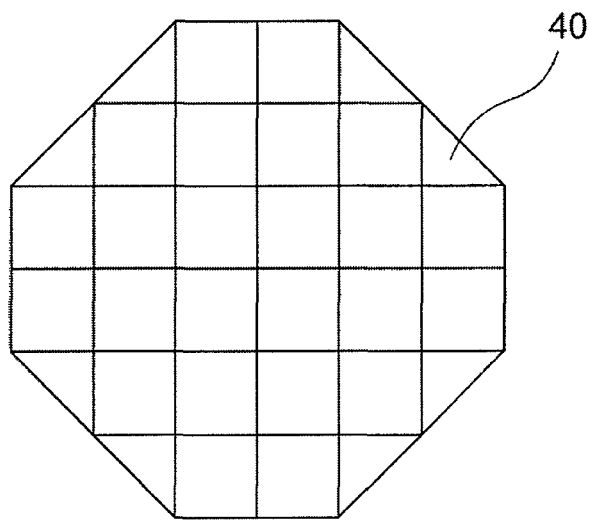
FIG. 8B is a schematic plan view of a pitch conversion board in still another embodiment of the present invention.

FIG. 7 is a schematic plan view of the pitch conversion board of the probe in the present embodiment, while FIG. 8A and FIG. 8B are schematic plan views of pitch conversion boards in another embodiment and still another embodiment of the present invention.

The pitch conversion board 40, for example, is a rigid board made of a ceramic etc. and has sufficient hardness so that the flexed pitch conversion board 40 will not contact the first frame 34 of the first anisotropic conductive rubber member 30 when a semiconductor wafer under test 100 is pushed against the probe 10. More specifically, as shown in FIG. 4, the pitch conversion board 40 has a hardness so that an amount of deformation per pitch Q between the first conductor parts 31 at the time of pushing is smaller than a height H from the first frame 34 to the top parts of the first conductor parts 31. Further, this pitch conversion board 40 has an about 6 ppm/° C. coefficient of thermal expansion. Note that, the pitch conversion board 40 is not limited to a ceramic board. For example, it may also be a board woven from an aramid fiber, or a board comprising: a core material having a resin impregnated with an aramid fiber or a core material made of 42Alloy; and a polyimide which is laminated on the core.

This pitch conversion board 40, as shown in FIG. 7, is divided into four sections. Note that, in the present invention, the number of sections forming the pitch conversion board is not particularly limited. As shown in FIG. 8A, it is also possible not to divide the pitch conversion board but to form it by a single board, or, as shown in FIG. 8B, form it by 32 sections. By dividing the pitch conversion board 40, fabrication of the pitch conversion board 40 is easier and the cost of the probe 10 can be reduced.

As shown in FIG. 3 and FIG. 4, first terminals 41 are provided on the bottom surface of this pitch conversion board 40 (surface facing first anisotropic conductive rubber member 30) so as to correspond to the first conductor parts 31 of the first anisotropic conductive rubber member 30. On the other hand, second terminals 42 are provided on the top surface of this pitch conversion board 40 (surface facing second anisotropic conductive rubber member 50) so as to correspond to the second conductor parts 51 (explained later) of the second anisotropic conductive rubber member 50. These terminals 41, 42 are electrically connected through interconnects 43 provided in the pitch conversion board 40.

In the present embodiment, as shown in FIG. 4, in the pitch conversion board 40, the pitch $P_2$ between the second terminals 42 is wider than the pitch $P_1$ between the first terminals 41 ($P_2 > P_1$), and the second terminals 42 are formed larger than the first terminals 41 ($S_2 > S_1$). For this reason, it is possible to absorb large thermal expansion or thermal contraction occurring in the circuit board 60 and possible to suppress poor electrical contact between component elements of the probe 10.

Figure 9A:
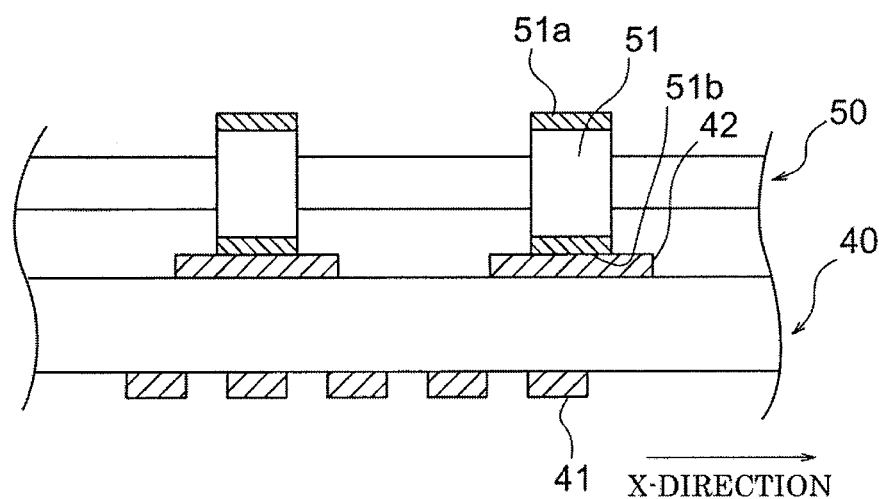
FIG. 9A is a schematic side view showing a positional relationship between a pitch conversion board and a second anisotropic conductive rubber member in an embodiment of the present invention and a view showing a positional relationship in an ordinary temperature state.
Figure 9B:
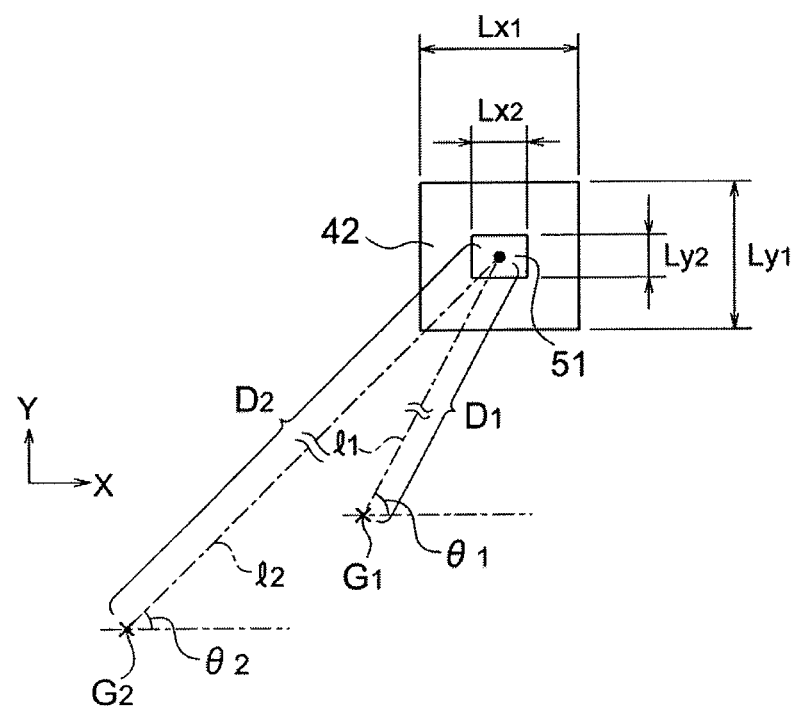
FIG. 9B is a schematic plan view showing a positional relationship between a second terminal and a second conductor part in an embodiment of the present invention and a view showing a positional relationship in an ordinary temperature state.
Figure 9C:
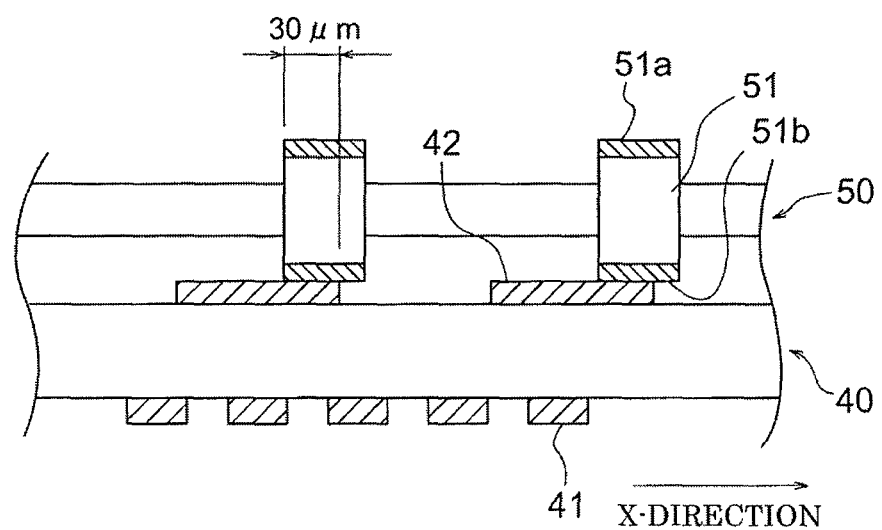
FIG. 9C is a schematic side view showing a positional relationship between a pitch conversion board and a second anisotropic conductive rubber member in an embodiment of the present invention and a view showing a positional relationship at a high temperature or low temperature state.
Figure 9D:
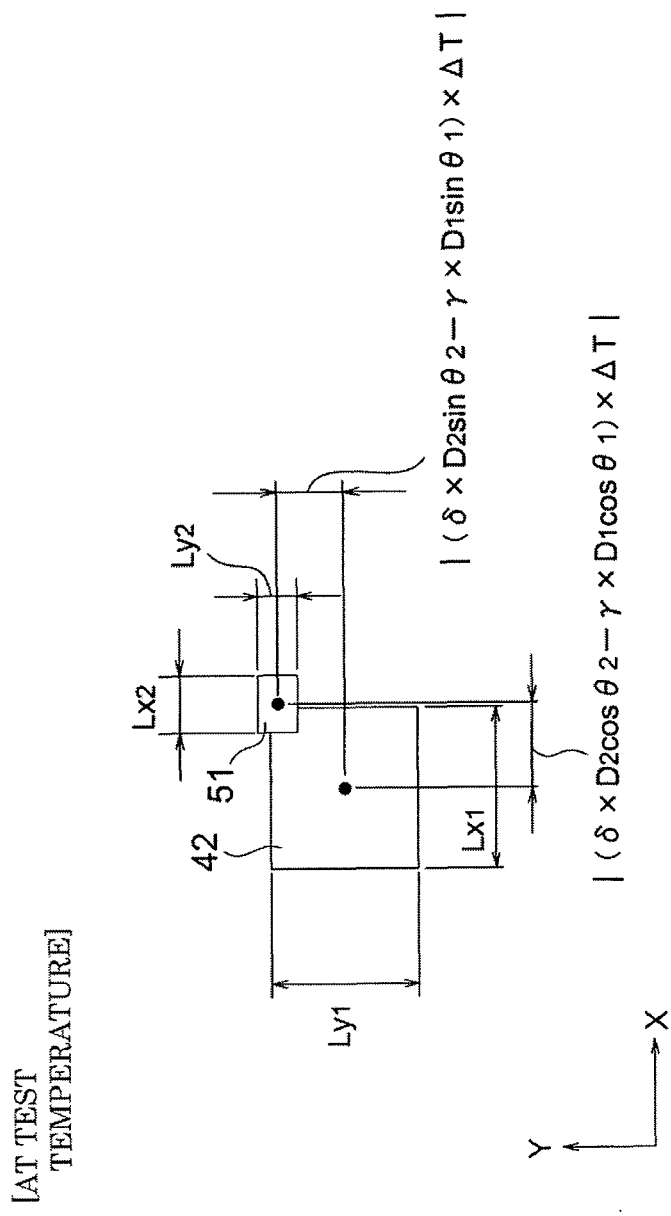
FIG. 9D is a schematic plan view showing a positional relationship between a second terminal and a second conductor part in an embodiment of the present invention and a view showing a positional relationship at a high temperature or low temperature state.

FIG. 9A and FIG. 9C are schematic side views showing the positional relationship between the pitch conversion board and the second anisotropic conductive rubber member in the present embodiment, while FIG. 9B and FIG. 9D are schematic plan views showing the positional relationship between the second terminal and the second conductor part in the present embodiment. In the present embodiment, the second terminals 42 of the pitch conversion board 40 and the second conductor parts 51 of the second anisotropic conductive rubber member 50 have sizes satisfying the following formulas (4) and (5).

$$(L_{x1}+L_{x2})/2 > |(\delta \times D_2 \cos \theta_2 - \gamma \times D_1 \cos \theta_1) \times \Delta T| \quad (4)$$

$$(L_{y1}+L_{y2})/2 > |(\delta \times D_2 \sin \theta_2 - \gamma \times D_1 \sin \theta_1) \times \Delta T| \quad (5)$$

where, in the above formulas (4) and (5), $\gamma$ is a coefficient of thermal expansion of the pitch conversion board 40, $\delta$ is a thermal expansion rate of the second anisotropic conductive rubber member 50, $D_1$ is a distance from a center of gravity $G_1$ of the pitch conversion board 40 to the second terminal 42, $D_2$ is a distance from a center of gravity $G_2$ of the second anisotropic conductive rubber member 50 to the second conductor part 51, $\theta_1$ is an angle of an imaginary line 1 connecting from a center of gravity $G_1$ of the pitch conversion board 40 to the second terminal 42 with respect to the X-axis, $\theta_2$ is an angle of an imaginary line $l_2$ connecting from a center of gravity $G_2$ of the second anisotropic conductive rubber member 50 to the second conductor part 51 with respect to the X-axis, $L_{x1}$ is a length of the second terminal 42 in the X-axial direction, $L_{x2}$ is a length of the second conductor part 51 in the X-axial direction, $L_{y1}$ is a length of the second terminal 42 in the Y-axial direction, $L_{y2}$ is a length of the second conductor part 51 in the Y-axial direction, and $\Delta T$ is a temperature difference between a test temperature and a room temperature. Note that, there is a relationship of $D_1$, $D_2 \gg L_{x1}$, $L_{x2}$, $L_{y1}$, $L_{y2}$. Further, as a specific numerical value of the test temperature, for example, −30 to +125° C. may be mentioned.

By the second terminals 42 and the second conductor parts 51 having sizes satisfying the above formulas (4) and (5), as shown in FIG. 9A to FIG. 9D, even if a thermal expansion difference or thermal contraction difference occurs in the pitch conversion board 40 and the second anisotropic conductive rubber member 50, the second terminal 42 and the bottom surface 51b of the second conductor part 51 will always overlap. In the present embodiment, as shown in FIG. 9C, even when the second terminal 42 has the most deformation, for example, an overlap of about 30 μm is constantly secured between the second terminal 42 and the bottom surface 51b of the conductor part 51.

Note that, the extent of this overlap is not particularly limited in numerical value so long as it is possible to apply pressure between the second terminal 42 and the second conductor part 51 in the thickness direction and it is possible to stably transmit the test signals. Further, in FIG. 9B and FIG. 9D, the second terminal 42 and the second conductor part 51 are shown by rectangular cross-sectional shapes, but the invention is not particularly limited to this. For example, circular cross-sectional shapes are also possible. Note that, the above formulas (4) and (5) need only be satisfied for each divided section of the pitch conversion board 40.

Further, as shown in FIG. 7, this pitch conversion board 40 is provided with alignment-use first through holes 44 in order to enable high precision positioning of the component members 20 to 60 with each other when assembling the probe 10. In the present embodiment, three holes are formed in each of the four sections forming the pitch conversion board 40.

The second anisotropic conductive rubber member 50, as shown in FIG. 3 and FIG. 4, in the same way as the first anisotropic conductive rubber member 30, comprises: second conductor parts 51 having particle dispersion parts 52 and insulating parts 53; and a second frame 54. The second conductor parts 51 are arranged so as to correspond to the second terminals 42 of the pitch conversion board 40. The second anisotropic conductive rubber member 50 has an about 9.5 to 10.5 ppm/° C. coefficient of thermal expansion. In the present embodiment, the material forming the second frame 54 is selected so that the second anisotropic conductive rubber member 50 has such a thermal expansion rate. Specifically, for example, 426Alloy or SUS410 is used to form the second frame 54. Note that, the material forming the second frame 54 is not particularly limited to this. For example, iron, copper, nickel, chrome, cobalt, magnesium, manganese, molybdenum, indium, lead, palladium, titanium, tungsten, aluminum, gold, platinum, silver, or alloys of the same etc. may also be used. Further, the thermal expansion rate of the second anisotropic conductive rubber member 50 may also be set substantially the same as the coefficient of thermal expansion of the pitch conversion board 40.

Figure 10:
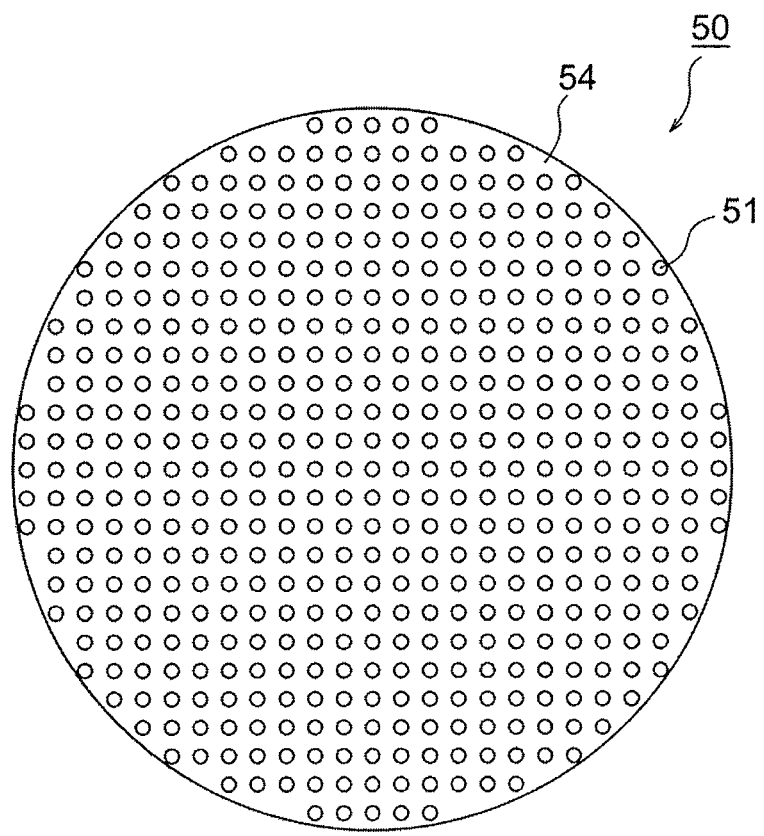
FIG. 10 is a plan view of a second anisotropic conductive rubber member in an embodiment of the present invention.

FIG. 10 is a plan view showing the second anisotropic conductive rubber member in the present embodiment. In the present embodiment, as shown in FIG. 10, a plurality of second conductor parts 51 are provided over the whole of the second anisotropic conductive rubber member 50 so as to substantially evenly disperse. Due to this, when a semiconductor wafer under test 100 is pushed against the probe 10, the pitch conversion board 40 is resistant to warping, the first anisotropic conductive rubber member 30 can be applied with pressure substantially evenly, and occurrence of poor electrical contact can be suppressed.

Figure 11:
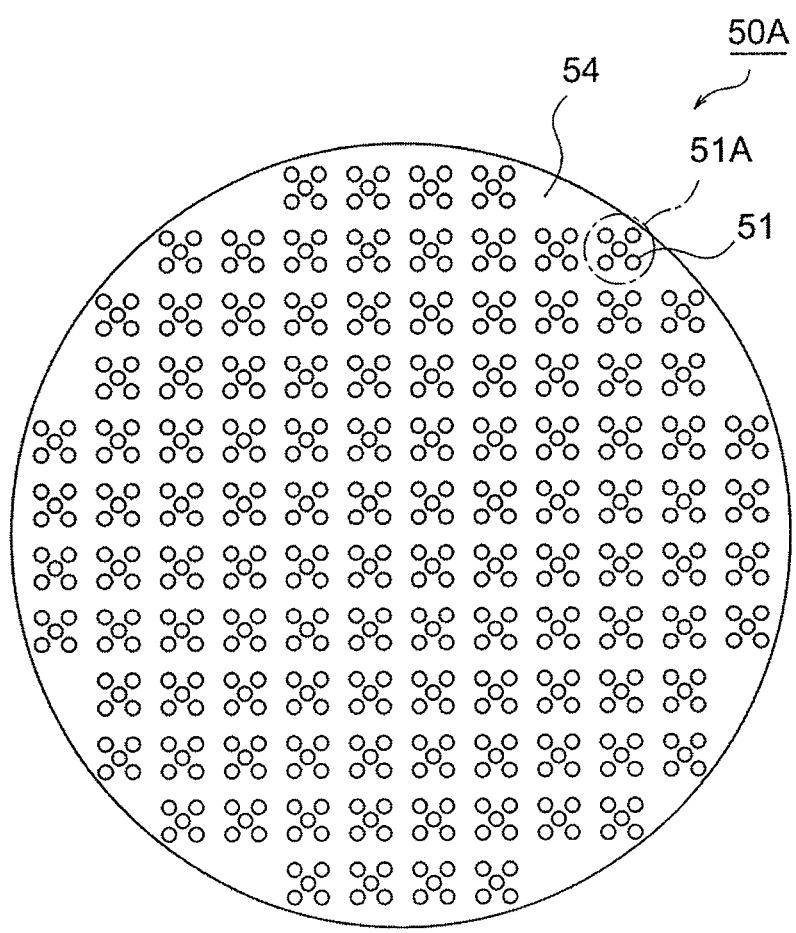
FIG. 11 is a plan view of another example of a second anisotropic conductive rubber member in an embodiment of the present invention.

FIG. 11 is a plan view showing another example of the second anisotropic conductive rubber member in the present embodiment. In the second anisotropic conductive rubber member 50A shown in FIG. 11, conductor groups 51A each of which has a plurality of (in this example, five) second conductor parts 51 are arranged over the whole of the second anisotropic conductive rubber member 50A so as to substantially evenly disperse. Furthermore, the five second conductor parts 51 are arranged so as to substantially evenly disperse in each of conductor groups 51A. Note that, in the present invention, as long as the conductor groups 51A are arranged on the second anisotropic conductive rubber member 50A so as to substantially evenly disperse, the second conductor parts 51 do not necessarily have to be arranged in the conductor groups 51A so as to evenly disperse. For example, it is also possible to randomly arrange the second conductor parts 51 in the respective conductor groups 51A or to make the arrangements of the second conductor parts 51 different among the conductor groups 51A.

Figure 12A:
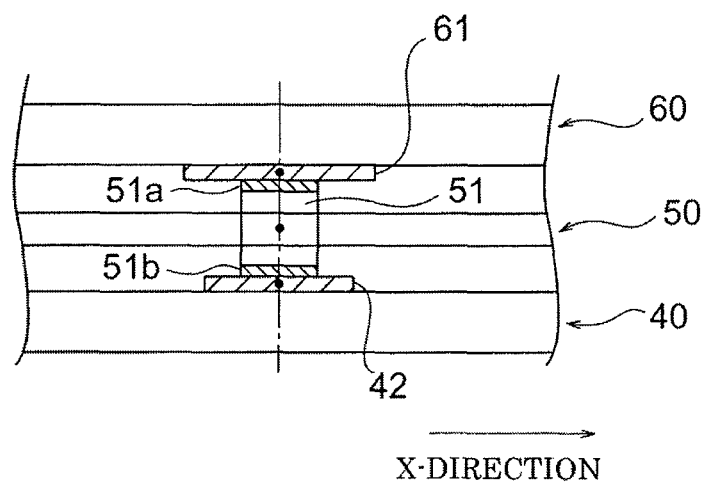
FIG. 12A is a schematic side view showing a positional relationship between a pitch conversion board, a second anisotropic conductive rubber member, and a circuit board in an embodiment of the present invention and a view showing a positional relationship at an ordinary temperature state.
Figure 12B:
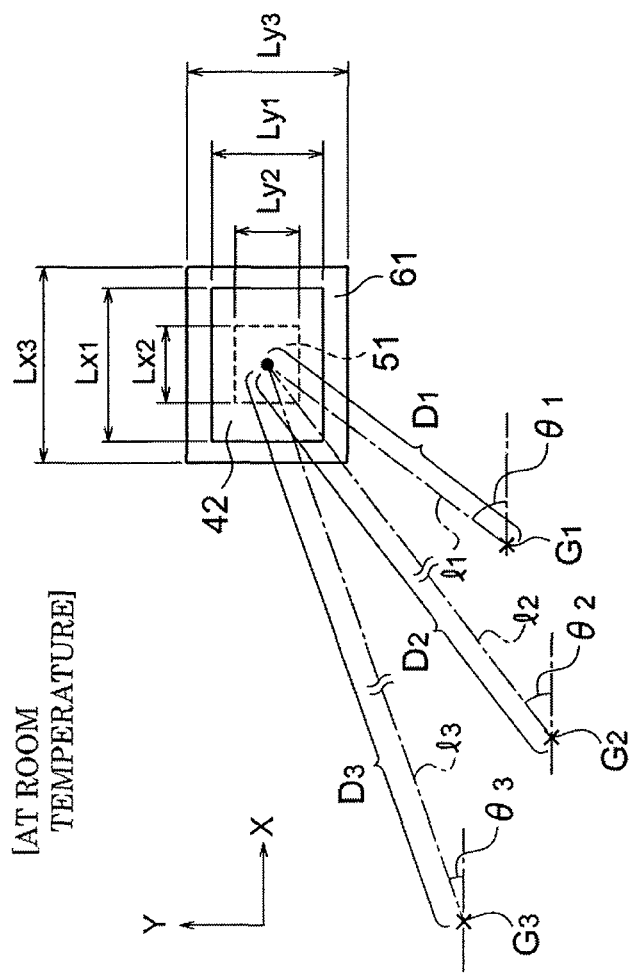
FIG. 12B is a schematic plan view showing a positional relationship between a second terminal, a second conductor part, and a third terminal in an embodiment of the present invention and a view showing a positional relationship at an ordinary temperature state.
Figure 12C:
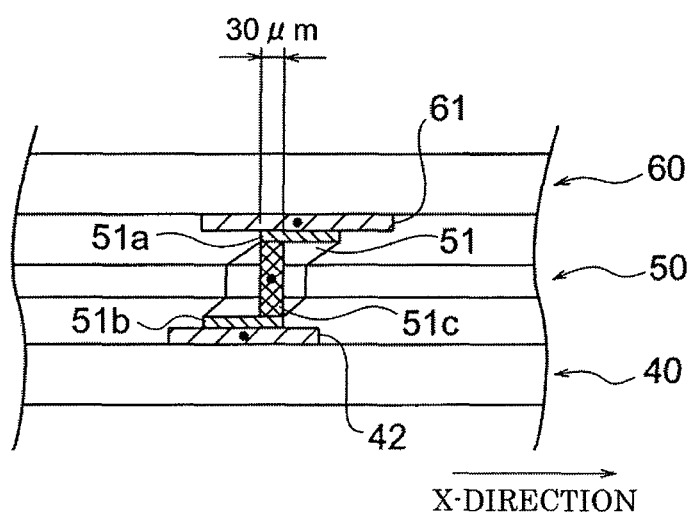
FIG. 12C is a schematic side view showing a positional relationship between a pitch conversion board, a second anisotropic conductive rubber member, and a circuit board in an embodiment of the present invention and a view showing a positional relationship at a high temperature or low temperature state.
Figure 12D:
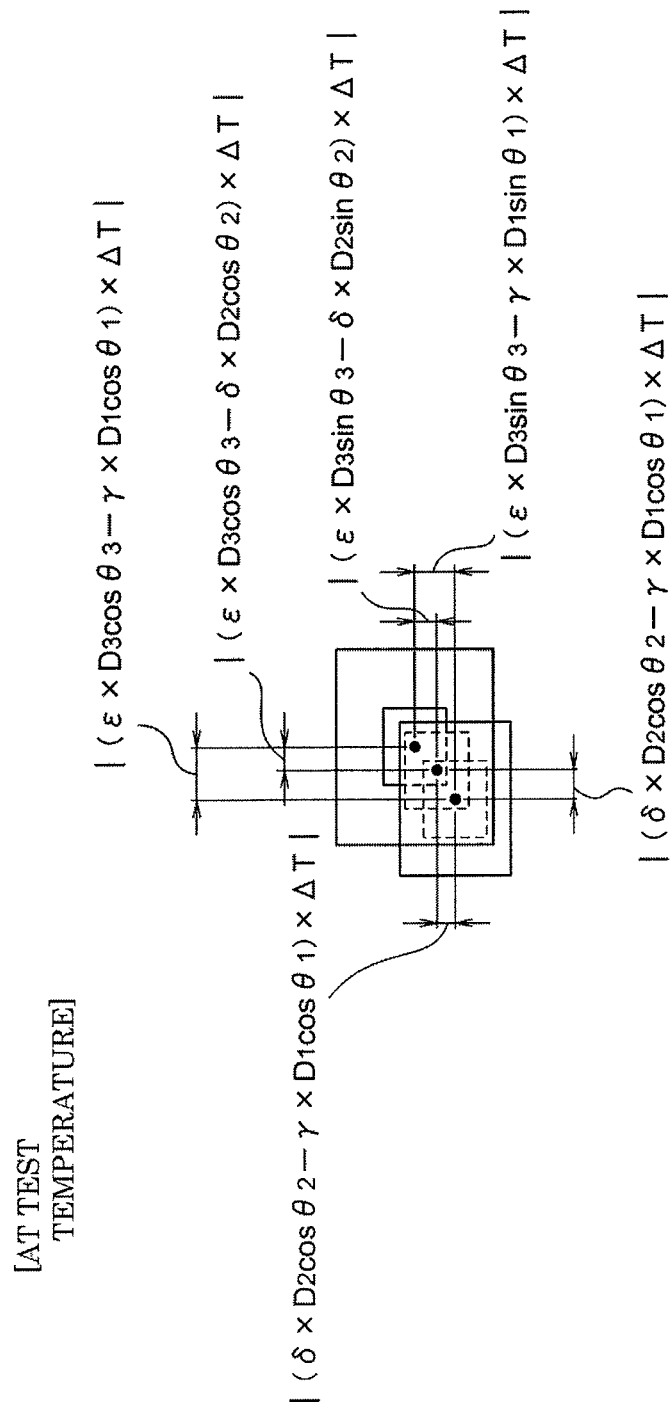
FIG. 12D is a schematic plan view showing a positional relationship between a second terminal, a second conductor part, and a third terminal in an embodiment of the present invention and a view showing a positional relationship at a high temperature or low temperature state.

FIG. 12A and FIG. 12C are schematic side views showing the positional relationship among the pitch conversion board, the second anisotropic conductive rubber member, and the circuit board in the present embodiment, while FIG. 12B and FIG. 12D are schematic plan views showing the positional relationship among the second terminal, the second conductor part, and the third terminal in the present embodiment.

If a thermal expansion difference or thermal contraction difference occurs between the pitch conversion board 40 and the circuit board 50 in the state where the top and bottom surfaces 51a, 51b of the second conductor parts 51 of the second anisotropic conductive rubber member 50 are lightly stuck to the terminals 61, 42, sometimes the second conductor parts 51 of the second anisotropic conductive rubber member 50 will deform at a slant. As opposed to this, in the present embodiment, the top and bottom surfaces 51a, 51b of the second conductor parts 51 have sizes satisfying the following formulas (8) and (9).

$$L_{x2} > |(\epsilon \times D_3 \cos\theta_3 - \gamma \times D_1 \cos\theta_1) \times \Delta T| \quad (8)$$

$$L_{y2} > |(\epsilon \times D_3 \sin\theta_3 - \gamma \times D_1 \sin\theta_1) \times \Delta T| \quad (9)$$

where, in the above formula (8) and formula (9), $\gamma$ is a coefficient of thermal expansion of the pitch conversion board 40, $\epsilon$ is a coefficient of thermal expansion of the circuit board 60, $D_1$ is a distance from a center of gravity $G_1$ of the pitch conversion board 40 to the second terminal 42, $D_3$ is a distance from a center of gravity $G_3$ of the circuit board 60 to the third terminal 61, $\theta_1$ is an angle of an imaginary line $l_1$ connecting from a center of gravity $G_1$ of the pitch conversion board 40 to the second terminal 51 with respect to an X-axis, $\theta_3$ is an angle of an imaginary line $l_3$ connecting from a center of gravity $G_3$ of the circuit board 60 to the third terminal 61 with respect to an X-axis, $L_{x2}$ is a length of the second conductor part 51 in the X-axial direction, $L_{y2}$ is a length of the second conductor part 51 in the Y-axial direction, and $\Delta T$ is a temperature difference between a test temperature and a room temperature. Note that, there is a relationship of $D_1$, $D_2$, $D_3 \gg L_{x1}$, $L_{x2}$, $L_{x3}$, $L_{y1}$, $L_{y2}$, $L_{y3}$. Further, in the present embodiment, the top surfaces 51a and the bottom surfaces 51b of the second conductor part 51 have substantially the same sizes.

By the top and bottom surfaces 51a, 51b of the second conductor parts 51 having sizes satisfying the above formulas (8) and (9), as shown in FIG. 12A to FIG. 12D, even if the second conductor part 51 deforms, the top and bottom surfaces 51a, 51b of the second conductor part 51 will always overlap. In the present embodiment, as shown in FIG. 12C, an overlap 51c of about 30 μm is constantly secured between the top and bottom surfaces 51a, 51b of the second conductor part 51.

Note that, the extent of this overlap 51c is not particularly limited in numerical value so long as it is possible to apply pressure between the top surfaces 51a and the bottom surfaces 51b of the second conductor part 51 in the thickness direction and it is possible to stably transmit the test signals. Further, in FIG. 12B and FIG. 12D, the second terminal 42, the second conductor part 51, and the third terminal 61 are shown by rectangular cross-sectional shapes, but the invention is not particularly limited to this. For example, circular cross-sectional shapes are also possible. Note that, the above formulas (8) and (9) need only be satisfied for each divided section of the pitch conversion board 40.

Further, as shown in FIG. 6, in the same way as the first anisotropic conductive rubber member 30, the second anisotropic conductive rubber member 50 is formed with alignment-use second through holes 55 so as to correspond to the first through holes 44 provided in the pitch conversion board 40 in order to enable high precision positioning of the component members 20 to 60 when assembling the probe 10.

The circuit board 60, for example, is a printed circuit board made of a glass epoxy resin or other plastic material and has an about 13 to 18 ppm/° C. coefficient of thermal expansion. As shown in FIG. 3 and FIG. 4, third terminals 61 is formed on the bottom surface of the circuit board 60 (surface facing second anisotropic conductive rubber member 50) so as to correspond to the second terminals 42 by means of printing or plating copper etc. and etching.

On the other hand, as shown in FIG. 2 and FIG. 3, connectors 62 comprising for example ZIF (zero insertion force) connectors or LIF (low insertion force) connectors is provided on the top surface of the circuit board 60 (surface facing wafer mother board 3). These third terminals 61 and connectors 62 are electrically connected through interconnects provided in the circuit board 60. Note that, in FIG. 2, only four connectors 62 are mounted on the circuit board 60, but in actuality, a large number of connectors 62 are mounted at the peripheral edges of the circuit board 60 across its entire circumference.

Further, in the present embodiment, as shown in FIG. 3, bypass capacitors 90 are mounted on the top surface of the circuit board 60. By arranging bypass capacitors 90 near the IC devices in this way, it is possible to keep the drop in power source voltage as small as possible. Note that, in addition to bypass capacitors, it is also possible to mount for example resistors, coils, capacitors etc. or switches etc. for correcting the signal waveforms or correcting impedance, or other electronic devices used for testing IC devices, on the top surface of the circuit board 60.

Figure 13A:
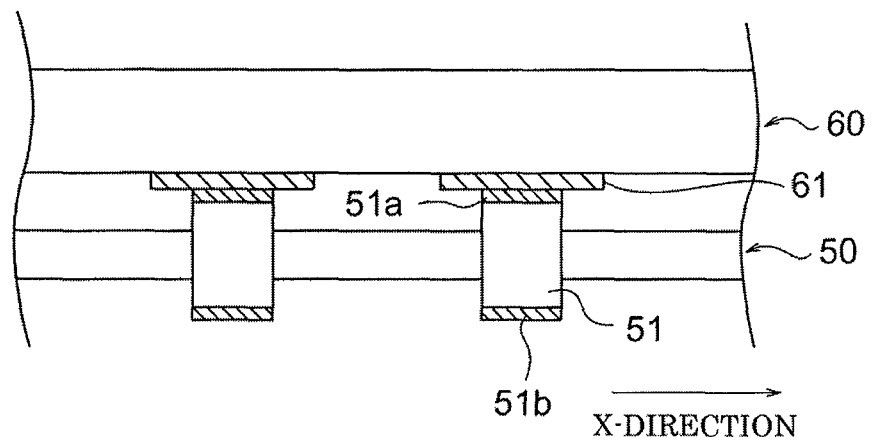
FIG. 13A is a schematic side view showing a positional relationship between a second anisotropic conductive rubber member and a circuit board in an embodiment of the present invention and a view showing a positional relationship at an ordinary temperature state.
Figure 13B:
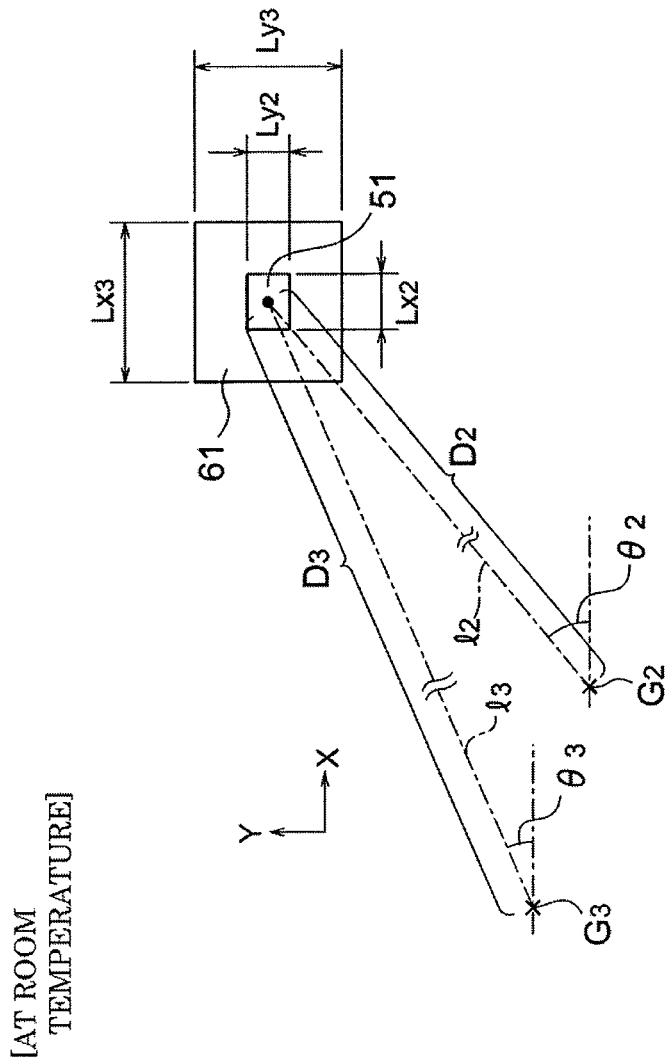
FIG. 13B is a schematic plan view showing a positional relationship between a second conductor part and a third terminal in an embodiment of the present invention and a view showing a positional relationship at an ordinary temperature state.
Figure 13C:
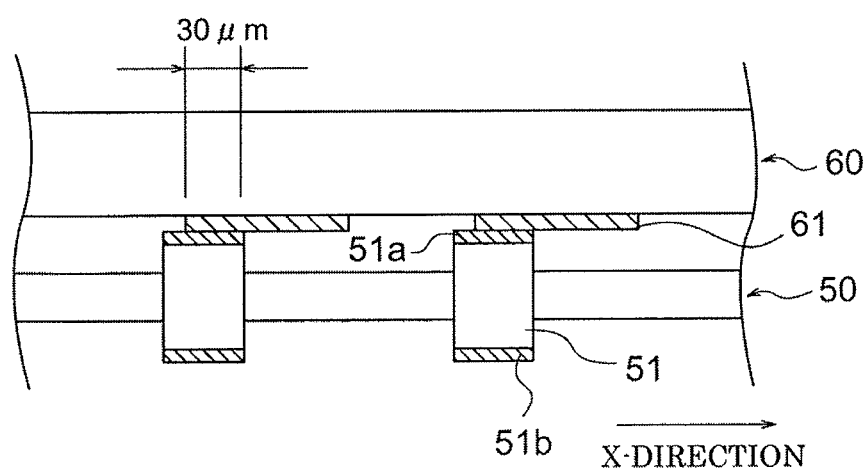
FIG. 13C is a schematic side view showing a positional relationship between a second anisotropic conductive rubber member and a circuit board in an embodiment of the present invention and a view showing a positional relationship at a high temperature or low temperature state.
Figure 13D:
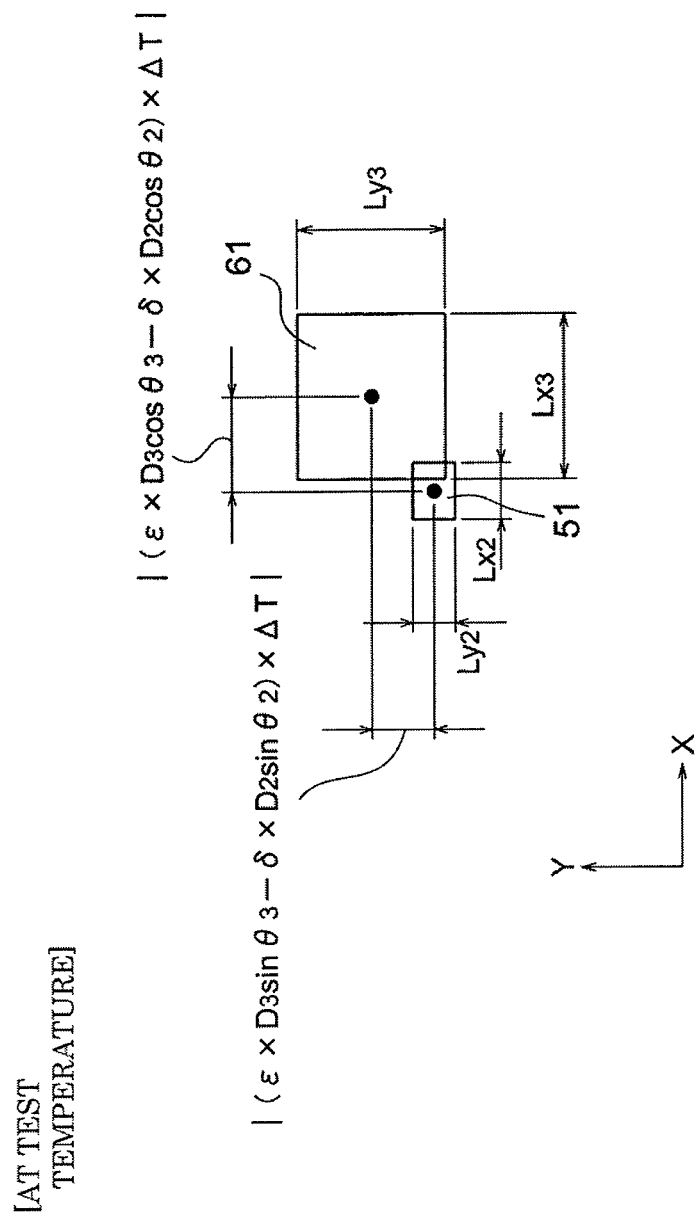
FIG. 13D is a schematic plan view showing a positional relationship between a second conductor part and a third terminal in an embodiment of the present invention and a view showing a positional relationship at a high temperature or low temperature state.

FIG. 13A and FIG. 13C are schematic side views showing the positional relationship between the second anisotropic conductive rubber member and the circuit board in the present embodiment, while FIG. 13B and FIG. 13D are schematic plan views showing the positional relationship between the second conductor part and the third terminal in the present embodiment. In the present embodiment, the second conductor parts 51 of the second anisotropic conductive rubber member 50 and the third terminals 61 of the circuit board 60 have sizes satisfying the following formulas (6) and (7).

$$(L_{x2}+L_{x3})/2 > |(\epsilon \times D_3 \cos\theta_3 - \delta \times D_2 \cos\theta_2) \times \Delta T| \quad (6)$$

$$(L_{y2}+L_{y3})/2 > |(\epsilon \times D_3 \sin\theta_3 - \delta \times D_2 \sin\theta_2) \times \Delta T| \quad (7)$$

where, in the above formulas (6) and (7), $\delta$ is a thermal expansion rate of the second anisotropic conductive rubber member 50, $\epsilon$ is a coefficient of thermal expansion of the circuit board 60, $D_2$ is a distance from a center of gravity $G_2$ of the second anisotropic conductive rubber member 50 to the second conductor part 51, $D_3$ is a distance from a center of gravity $G_3$ of the circuit board 60 to the third terminal 61, $\theta_2$ is an angle of an imaginary line $l_2$ connecting from a center of gravity $G_2$ of the second anisotropic conductive rubber to the second conductor part 51 with respect to the X-axis, $\theta_3$ is an angle of an imaginary line $l_3$ connecting from a center of gravity $G_3$ of the circuit board 60 to the third terminal 61 with respect to the X-axis, $L_{x2}$ is a length of the second conductor part 51 in the X-axial direction, $L_{y2}$ is a length of the second conductor part 51 in the Y-axial direction, $L_{x3}$ is a length of the third terminal 61 in the X-axial direction, $L_{y3}$ is a length of the third terminal 61 in the Y-axial direction, and $\Delta T$ is a temperature difference between a test temperature and a room temperature. Note that, there is a relationship of $D_2$, $D_3 \gg L_{x2}$, $L_{x3}$, $L_{y2}$, $L_{y3}$.

By the second conductor parts 51 and the third terminals 61 having sizes satisfying the above formulas (6) and (7), as shown in FIG. 13A to FIG. 13D, even if a thermal expansion difference or thermal contraction difference occurs between the second anisotropic conductive rubber member 50 and the circuit board 60, the third terminal 61 and the top surface 51a of the second conductor part 51 will always overlap. In the present embodiment, as shown in FIG. 13C, for example, an overlap of about 30 μm is constantly secured between the third terminal 61 and the top surface 51a of the conductor part 51.

Note that, the extent of this overlap is not particularly limited in numerical value so long as it is possible to apply pressure between the second conductor part 51 and the third terminal 61 in the thickness direction and it is possible to stably transmit the test signals. Further, in FIG. 13B and FIG. 13D, the second conductor part 51 and the third terminal 61 are shown by rectangular cross-sectional shapes, but the invention is not particularly limited to this. For example, circular cross-sectional shapes are also possible.

Further, as shown in FIG. 5, cross-shaped alignment marks 63 are provided on the bottom surface of the circuit board 60 in order to enable high precision positioning of the component members 20 to 60 when assembling the probe 10. The alignment marks 63 are formed at the same step as the step of forming the third terminals 61 on the circuit board 60 so as to correspond to the first through holes 44 of the pitch conversion board 40. Note that, the shape of the alignment marks 63 are not limited to a cross shape. Any shape can be employed.

As shown in FIG. 3, a ring-shaped first sealing member 70 is attached so as to cover the area between the peripheral edges of the top surface of the membrane 20 and the bottom surface of the circuit board 60. This first sealing member 70 is for example made of a material like silicone rubber which can elastically deform and is superior in sealing property. It covers the first anisotropic conductive rubber member 30, the pitch circuit board 40, and the second anisotropic conductive rubber member 50.

In the present embodiment, the first sealing member 70 has substantially the same height as the height from the membrane 10 to the circuit board 60 and holds the membrane 10 in a flat state. Further, the first sealing member 70 has a rectangular cross-section with a ratio of height h and width w of for example 1:5 to 1:20 or so. By making the ratio of "h" and "w" at least 1:5, the first sealing member 70 will hardly be pulled into the inside by the pressure reduction. On the other hand, by making the ratio of "h" and "w" 1:20 or less, it is possible to suppress the increase in size of the probe. Further, if the ratio of "h" and "w" is greater than 1:20, the first sealing member 70 is resistant to compression.

The probe 10 explained above satisfies the following formulas (1) to (3).

$$\alpha \leq \gamma < \epsilon \quad (1)$$

$$\alpha \leq \beta \leq \gamma \quad (2)$$

$$\gamma \leq \delta < \epsilon \quad (3)$$

where, in the above formula (1) to formula (3), $\alpha$ is a coefficient of thermal expansion of the semiconductor wafer under test 100, $\beta$ is a thermal expansion rate of the first anisotropic conductive rubber member 30, $\gamma$ is a coefficient of thermal expansion of the pitch circuit board 40, $\delta$ is a thermal expansion rate of the second anisotropic conductive rubber member 50, and $\epsilon$ is a coefficient of thermal expansion of the circuit board 60.

In this way, by increasing in stages the coefficients of thermal expansion of the first anisotropic conductive rubber member 30, the pitch circuit board 40, and the second anisotropic conductive rubber member 50 interposed between the semiconductor wafer under test 100 and the circuit board 60 which greatly differ in coefficients of thermal expansion, it is possible to suppress the occurrence of poor electrical contact between the component elements 20 to 60 of the probe 10. Further, the probe 10 in the present embodiment satisfies the following formulas (10) and (11).

$$(\gamma-\alpha) \times \Delta T \times D_4 \leq 0.2 \times t_1 \quad (10)$$

$$(\epsilon-\gamma) \times \Delta T \times D_5 \leq 0.2 \times t_2 \quad (11)$$

where, in the above formulas (10) and (11), $\alpha$ is a coefficient of thermal expansion of the semiconductor wafer under test 100, $\gamma$ is a coefficient of thermal expansion of the pitch conversion board 40, $\epsilon$ is a coefficient of thermal expansion of a circuit board 60, $\Delta T$ is a temperature difference between a test temperature and a room temperature, $D_4$ is a distance from a center of gravity $G_1$ of the pitch conversion board 40 to the first terminal 41 at the most distant position, $D_5$ is a distance from a center of gravity $G_1$ of the pitch conversion board 40 to the second terminal 42 at the most distant position, $t_1$ is a thickness of the first conductor part 31, and $t_2$ is a thickness of the second conductor part 51.

If a thermal expansion difference or thermal contraction difference occurs between the semiconductor wafer 100 and the pitch conversion board 40, the first conductor parts 31 of the first anisotropic conductive rubber member 30 will deform at a slant and gaps will be formed between conductive particles in the conductor parts 31. For this reason, unless increasing the pressure applied to the conductor parts 31, the conductive state can no longer be secured. On the other hand, if the pressure becomes excessive, the pressure applied to the input/output terminals 110 of the semiconductor wafer under test 100 will fluctuate and the test characteristics will end up being influenced.

As opposed to this, in the present embodiment, by the probe 10 satisfying the above formula (10), it is possible to increase the pressure applied to the first conductor parts 31 within a range not affecting the test characteristics. Similarly, by the probe 10 satisfying the above formula (11), it is possible to increase the pressure applied to the second conductor parts 51 within a range not affecting the test characteristics.

Further, if the lateral stress applied to the conductor parts 31, 51 of the anisotropic conductive rubber members 30, 50 becomes larger, the stress limit will be exceeded and the recovery force will end up being lost. As opposed to this, in the present embodiment, by satisfying the above formulas (10) and (11), the stress applied in the horizontal direction can be kept within a range not influencing the lifetimes of the conductor parts 31, 51. Note that, the above formulas (10) and (11) need only be satisfied for each divided section of the pitch conversion board 40.

Figure 14:
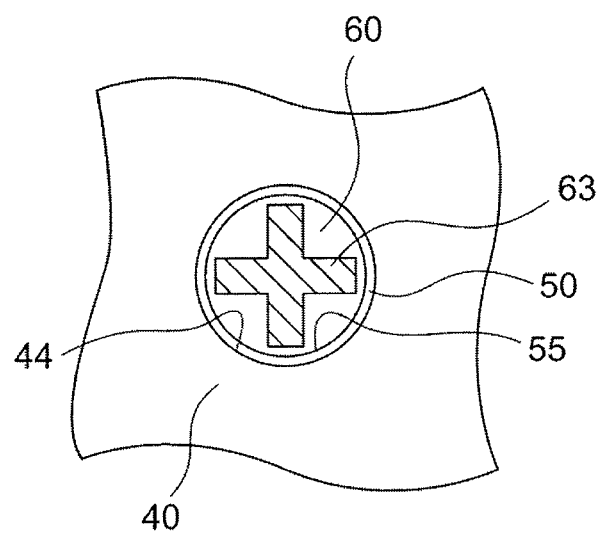
FIG. 14 is a plan view showing a positional relationship between an alignment mark and a through hole when assembling a probe in an embodiment of the present invention.

FIG. 14 is a plan view showing the positional relationship between the alignment mark and the through hole when assembling the probe in the present embodiment. The above such configured probe 10 is assembled by the following procedure.

First, the circuit board 60 is placed so that the alignment marks 63 face upward. Next, as shown in FIG. 14, the second anisotropic conductive rubber member 50 is positioned with respect to the circuit board 60 so that the alignment marks 63 are positioned at the approximate centers of the second through holes 55 of the second anisotropic conductive rubber member 50. In this state, the second anisotropic conductive rubber member 50 is stacked over the circuit board 60.

Next, as shown in the figure, the pitch circuit board 40 is positioned with respect to the circuit board 60 so that the alignment marks 63 of the circuit board 60 are positioned at the approximate centers of the first through holes 44 of the pitch conversion board 40. In this state, the pitch conversion board 40 is stacked over the second anisotropic conductive rubber member 50.

After this, by the same procedure, the first anisotropic conductive rubber member 30 is positioned with respect to the circuit board 60 and in that state the first anisotropic conductive rubber member 30 is stacked on the pitch circuit board 40. Next, the membrane 20 is stacked on the first anisotropic conductive rubber member 30. At this time, by seeing through and stacking the bumps 20 or conductive patterns 23 of the membrane 20 on the conductor parts 31 of the first anisotropic conductive rubber member 30, the membrane 20 is positioned with respect to the first anisotropic conductive rubber member 30.

Note that, by seeing through and stacking the first conductor parts 31 of the first anisotropic conductive rubber member 30 on the first terminals 41 of the pitch conversion board 40, it is possible to position the first anisotropic conductive rubber member 30 with respect to the pitch conversion board 40. Further, since the membrane 20 side is also provided with alignment marks 24, it is also possible to use those marks 24 as the reference for assembling the probe 10 by a procedure reverse to that of the above assembly method.

The above such configured probe 10, as shown in FIG. 1, is electrically connected to the wafer mother board 3 by connection of the connectors 62 provided on the circuit board 60 to connectors 3a provided on the wafer mother board 3. Furthermore, the wafer mother board 3 is electrically connected to the test head 2 connected to the tester through cables.

On the other hand, a wafer tray 4 holding the semiconductor wafer under test 100 by suction etc. is arranged below the probe 10. This wafer tray 4 can move in the XYZ directions and can rotate about a Z-axis by not particularly shown movement devices and can move a held semiconductor wafer 100 to a position facing the probe 10.

Further, a second sealing member 4a is provided at the peripheral edge of the wafer tray 4 across the entire circumference. This second sealing member 4a, like the first sealing member 70, is for example made of silicone rubber or other material which can elastically deform and which is superior in sealing property. When the wafer tray 4 approaches the probe 10 and the second sealing member 4a closely contacts the membrane 20, the wafer tray 4, the sealing members 70, 4a, the membrane 20, and the circuit board 60 form a sealed space 80 containing the first and second anisotropic conductive rubber members 30, 50 and the pitch conversion board 40 (see FIG. 15). Note that, while not particularly shown, through holes are formed in the membrane 20 in order to communicate the space defined by the first sealing member 70 and the space defined by the second sealing member 4a.

As shown in FIG. 1, a communicating path 4b with one end opening at the hermetic space 80 and the other end opening at the side surface of the wafer tray 4 is formed inside the wafer tray 4. A pressure reduction device 5 is connected to the other end of the communicating path 4b through a hose pipe.

Figure 15:
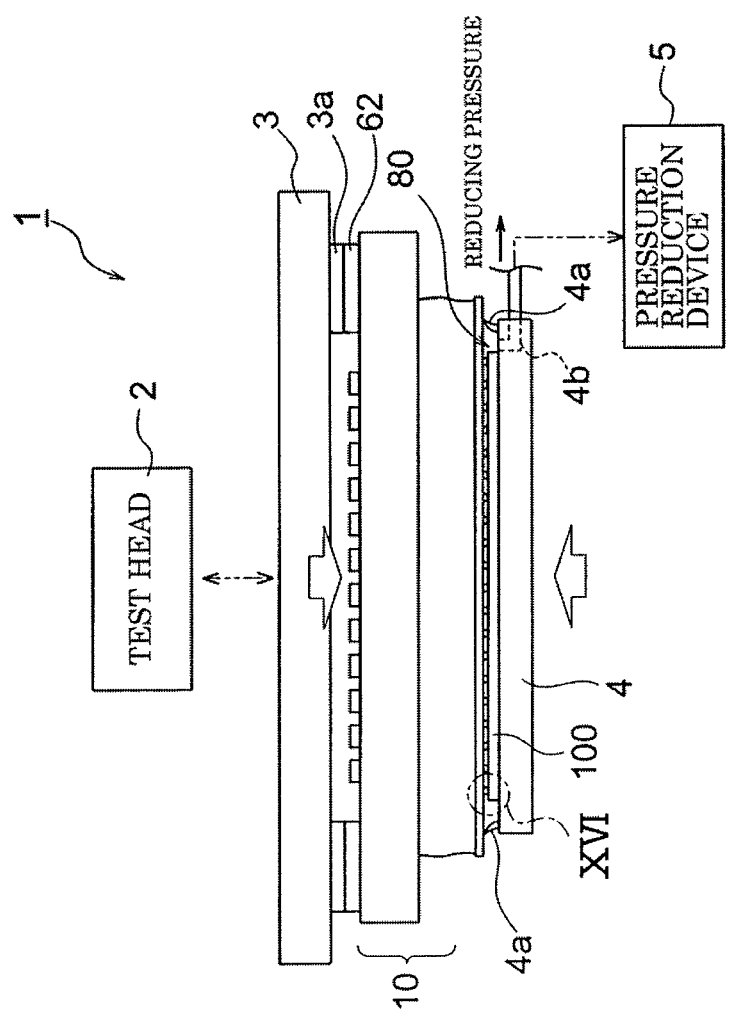
FIG. 15 is a schematic view showing a state where an electronic device test apparatus in an embodiment of the present invention runs a test of an IC device.
Figure 16:
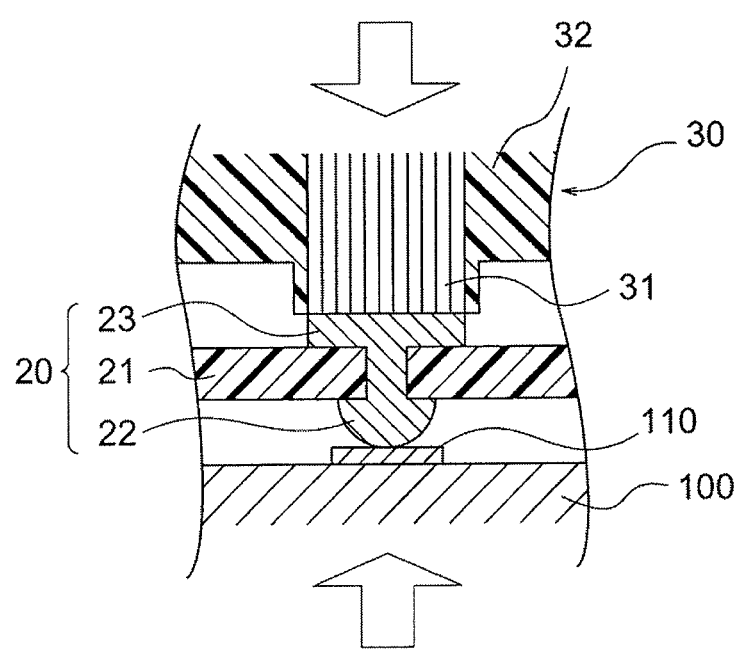
FIG. 16 is an enlarged cross-sectional view of an XVI part of FIG. 15.

FIG. 15 is a schematic view showing the state of an electronic device in the present embodiment running a test of IC devices, while FIG. 16 is an enlarged cross-sectional view of a part XVI of FIG. 15.

As shown in FIG. 15, by making the wafer tray 4 face the probe 10, making the second sealing member 4a closely contact the bottom surface of the membrane 20, and, in that state, using the pressure reduction device 5 to reduce the pressure in the hermetic space 80, the first sealing member 70 will deform, the conductor parts 31, 51 of the first and second anisotropic conductive rubber members 30, 50 will be compressed, and the bumps 22 of the membrane 20 will communicate with the third terminals 61 of the circuit board 60 through the first anisotropic conductive rubber member 30, pitch circuit board 40, and second anisotropic conductive rubber member 50.

At the same time as this, as shown in FIG. 16, the reduction of pressure in the sealed space 80 due to the pressure reduction device 5 causes the second sealing member 4a to deform, the wafer tray 4 and the probe 10 to further approach, and the bumps 22 of the membrane 20 to contact the input/output terminals 110 on the semiconductor wafer under test 100. In this state, the tester connected to the test head 2 inputs and receives test signals to and from the IC devices through the input/output terminals 110 so as to test the IC devices.

In the present embodiment, the second conductor parts 51 are arranged on the whole of the second anisotropic conductive rubber member 50 so as to substantially evenly disperse. For this reason, in the above tests of the IC devices, the pitch conversion board 40 will be resistant to warping and the first anisotropic conductive rubber member 30 can be applied with pressure substantially evenly, so it is possible to suppress the occurrence of poor electrical contact.

In particular, in the present embodiment, the pitch conversion board 40 is divided into four sections, but as explained above, the pitch conversion board 40 is substantially evenly pushed and, the sections of the pitch conversion board 40 will not incline at the time of pushing, so no members are required for bonding the divided sections of the pitch conversion board 40 with each other.

Further, in the present embodiment, even if applying thermal stress to the semiconductor wafer under test 100, since the pitch conversion board 40 having the second terminals 42 which are arranged at a broader pitch than the first terminals 41 and are larger than the first terminals 41 is interposed between the membrane 10 and the circuit board 60, it is possible to absorb large thermal expansion or thermal contraction occurring at the circuit board 60 and possible to suppress the occurrence of poor electrical contact between the component elements 20 to 60 of the probe 10.

Furthermore, in the present embodiment, the coefficients of thermal expansion of the membrane 20, the first anisotropic conductive rubber member 30, the pitch circuit board 40, and the second anisotropic conductive rubber member 50 become larger in stages from the semiconductor wafer under test 100 toward the circuit board 60, so it is possible to further suppress the occurrence of poor electrical contact between the component elements 20 to 60 of the probe 10.

Note that, the above explained embodiments were described to facilitate understanding of the present invention and were not described for limiting the present invention. Therefore, the elements disclosed in the above embodiments include all design changes and equivalents falling under the technical scope of the present invention.

For example, in the above embodiments, the example of application of the present invention to a test apparatus for testing IC devices built into a semiconductor wafer under test via a test head was explained, but the invention is not particularly limited to this. The present invention may also be applied to a wafer level burn-in apparatus where a tester sends and receives signals to and from an IC device without going through a test head and other electronic device test apparatuses.

REFERENCE SIGNS LIST

1 . . . electronic device test apparatus
2 . . . test head
3 . . . wafer mother board
3a . . . connector
4 . . . wafer tray
4a . . . second sealing member
4b . . . pressure reducing valve
5 . . . pressure reduction device
10 . . . probe
20 . . . membrane
21 . . . sheet-shaped member
22 . . . bump
23 . . . conductive pattern
24 . . . alignment mark
30 . . . first anisotropic conductive rubber
31 . . . first conductor part
32 . . . particle dispersion part
33 . . . insulating part
34 . . . first frame
35 . . . third through hole
40 . . . pitch conversion board
41 . . . first terminal
42 . . . second terminal
43 . . . signal line
44 . . . first through hole
50 . . . second anisotropic conductive rubber
51 . . . second conductor part
51a . . . top surface
51b . . . bottom surface
52 . . . particle dispersion part
53 . . . insulating part
54 . . . second frame
55 . . . second through hole
60 . . . circuit board
61 . . . third terminal
62 . . . connector 63 ... alignment mark
70 ... first sealing member
80 ... sealed space
90 ... bypass capacitor
100 ... semiconductor wafer under test
110 ... input/output terminal

The invention claimed is:

1. A probe comprising:
a membrane having contact terminals which contact input/output terminals of the electronic device under test;
a plurality of first boards each of which has a first main surface on which first terminals are provided and a second main surface on which second terminals electrically connected to the first terminals are provided;
a second board which is electrically connected to the electronic device test apparatus and has third terminals;
a first anisotropic conductivity elastic member having first conductor parts which electrically connect the contact terminals of the membrane and the first terminals of the first boards; and
a second anisotropic conductivity elastic member having second conductor parts which electrically connect the second terminals of the first boards and the third terminals of the second board, wherein
the second conductor parts are arranged on the whole of the second anisotropic conductivity elastic member, wherein
a plurality of the first boards are separated from each other so that a space is formed between the first boards, and
the first boards are sandwiched between the first anisotropic conductivity elastic member and the second anisotropic conductivity elastic member.

2. The probe as set forth in claim 1, wherein conductor groups each of which has at least one of the second conductor parts are arranged on the whole of the second anisotropic conductivity elastic member so as to substantially evenly disperse.

3. The probe as set forth in claim 2, wherein a plurality of the second conductor parts are arranged so as to substantially evenly disperse in each of the conductor groups.

4. The probe as set forth in claim 1, wherein each of the first boards is a rigid board.

5. The probe as set forth in claim 1, wherein
the first terminals are arranged so as to correspond to the input/output terminals provided on the semiconductor wafer under test or the contact terminals of the membrane, and
the second terminals are arranged so as to correspond to the third terminals of the second board.

6. The probe as set forth in claim 1, wherein when the second board is applied with pressure, the first boards are substantially evenly pressed through the second conductor parts of the second anisotropic conductivity elastic member.

7. The probe as set forth in claim 1, wherein the second terminals are arranged at a broader pitch than the first terminals or are formed larger than the first terminals.

8. The probe as set forth in claim 1, wherein the probe satisfies the following formula (1):

$$\alpha \leq \gamma < \epsilon \tag{1}$$

where, in the formula (1),
$\alpha$ is a coefficient of thermal expansion of the semiconductor wafer under test,
$\gamma$ is a coefficient of thermal expansion of the first boards, and
$\epsilon$ is a coefficient of thermal expansion of the second board.

9. The probe as set forth in claim 1, wherein the probe satisfies the following formula (2):

$$\alpha \leq \beta \leq \gamma \tag{2}$$

where, in the above formula (2),
$\alpha$ is a coefficient of thermal expansion of the semiconductor wafer under test,
$\beta$ is a thermal expansion rate of the first anisotropic conductivity elastic member, and
$\gamma$ is a coefficient of thermal expansion of the first boards.

10. The probe as set forth in claim 9, wherein
the first anisotropic conductivity elastic member has a first holder configured to hold the first conductor parts,
each of the first conductor parts has conductivity in only a thickness direction, and
a coefficient of thermal expansion of the first holder is set so that a thermal expansion rate of the first anisotropic conductivity elastic member satisfies the formula (2).

11. The probe as set forth in claim 1, wherein the probe satisfies the following formula (3):

$$\gamma \leq \delta < \epsilon \tag{3}$$

where, in the above formula (3),
$\gamma$ is a coefficient of thermal expansion of the first boards,
$\delta$ is a thermal expansion rate of the second anisotropic conductivity elastic member, and
$\epsilon$ is a coefficient of thermal expansion of the second board.

12. The probe as set forth in claim 11, wherein
the second anisotropic conductivity elastic member has a second holder configured to hold the second conductor parts,
each of the second conductor parts has conductivity in only a thickness direction, and
a coefficient of thermal expansion of the second holder is set so that a thermal expansion rate of the second anisotropic conductivity elastic member satisfies the formula (3).

13. A probe comprising:
a membrane having a contact terminal which contacts an input/output terminal of the electronic device under test;
a first board having a first main surface on which a first terminal is provided and a second main surface on which a second terminal electrically connected to the first terminal is provided;
a second board which is electrically connected to the electronic device test apparatus and has a third terminal;
a first anisotropic conductivity elastic member having a first conductor part which electrically connects the contact terminal of the membrane and the first terminal of the first board; and
a second anisotropic conductivity elastic member having a second conductor part which electrically connects the second terminal of the first board and the third terminal of the second board, wherein
the second conductor parts are arranged on the whole of the second anisotropic conductivity elastic member, and,
the probe satisfies the following formulas (4) and (5):

$$(L_{x1}+L_{x2})/2 > |(\delta \times D_2 \cos\theta_2 - \gamma \times D_1 \cos\theta_1) \times \Delta T| \tag{4}$$

$$(L_{y1}+L_{y2})/2 > |(\delta \times D_2 \sin\theta_2 - \gamma \times D_1 \sin\theta_1) \times \Delta T| \tag{5}$$

where, in the above formulas (4) and (5),
$\gamma$ is a coefficient of thermal expansion of the first board,
$\delta$ is a thermal expansion rate of the second anisotropic conductivity elastic member,
$D_1$ is a distance from a center of gravity of the first board to the second terminal, $D_2$ is a distance from a center of gravity of the second anisotropic conductivity elastic member to the second conductor part, $\theta_1$ is an angle of an imaginary line connecting from a center of gravity of the first board to the second terminal with respect to an X-axis, $\theta_2$ is an angle of an imaginary line connecting from a center of gravity of the second anisotropic conductivity elastic member to the second conductor part with respect to the X-axis, $L_{x1}$ is a length of the second terminal in the X-axial direction, $L_{x2}$ is a length of the second conductor part in the X-axial direction, $L_{y1}$ is a length of the second terminal in a Y-axial direction substantially perpendicular to the X-axis, $L_{y2}$ is a length of the second conductor part in the Y-axial direction, and $\Delta T$ is a temperature difference between a test temperature and a room temperature.

14. A probe comprising:
a membrane having a contact terminal which contacts an input/output terminal of the electronic device under test;
a first board having a first main surface on which a first terminal is provided and a second main surface on which a second terminal electrically connected to the first terminal is provided;
a second board which is electrically connected to the electronic device test apparatus and has a third terminal;
a first anisotropic conductivity elastic member having a first conductor part which electrically connects the contact terminal of the membrane and the first terminal of the first board; and
a second anisotropic conductivity elastic member having a second conductor part which electrically connects the second terminal of the first board and the third terminal of the second board, wherein
the second conductor parts are arranged on the whole of the second anisotropic conductivity elastic member, and,
the probe satisfies the following formulas (6) and (7):

$$(L_{x2}+L_{x3})/2 > |(\epsilon \times D_3 \cos\theta_3 - \delta \times D_2 \cos\theta_2) \times \Delta T| \quad (6)$$

$$(L_{y2}+L_{y3})/2 > |(\epsilon \times D_3 \sin\theta_3 - \delta \times D_2 \sin\theta_2) \times \Delta T| \quad (7)$$

where, in the above formulas (6) and (7), $\delta$ is a thermal expansion rate of the second anisotropic conductivity elastic member, $\epsilon$ is a coefficient of thermal expansion of the second board, $D_2$ is a distance from a center of gravity of the second anisotropic conductivity elastic member to the second conductor part, $D_3$ is a distance from a center of gravity of the second board to the third terminal, $\theta_2$ is an angle of an imaginary line connecting from a center of gravity of the second anisotropic conductivity elastic member to the second conductor part with respect to an X-axis, $\theta_3$ is an angle of an imaginary line connecting from a center of gravity of the second board to the third terminal with respect to the X-axis, $L_{x2}$ is a length of the second conductor part in the X-axial direction, $L_{x3}$ is a length of the third terminal in the X-axial direction, $L_{y2}$ is a length of the second conductor part in a Y-axial direction substantially perpendicular to the X-axis, $L_{y3}$ is a length of the third terminal in the Y-axial direction, and $\Delta T$ is a temperature difference between a test temperature and a room temperature.

15. A probe comprising:
a membrane having a contact terminal which contacts an input/output terminal of the electronic device under test;
a first board having a first main surface on which a first terminal is provided and a second main surface on which a second terminal electrically connected to the first terminal is provided;
a second board which is electrically connected to the electronic device test apparatus and has a third terminal;
a first anisotropic conductivity elastic member having a first conductor part which electrically connects the contact terminal of the membrane and the first terminal of the first board; and
a second anisotropic conductivity elastic member having a second conductor part which electrically connects the second terminal of the first board and the third terminal of the second board, wherein
the second conductor parts are arranged on the whole of the second anisotropic conductivity elastic member, and,
the probe satisfies the following formulas (8) and (9):

$$L_{x2} > |(\epsilon \times D_3 \cos\theta_3 - \gamma \times D_1 \cos\theta_1) \times \Delta T| \quad (8)$$

$$L_{y2} > |(\epsilon \times D_3 \sin\theta_3 - \gamma \times D_1 \sin\theta_1) \times \Delta T| \quad (9)$$

where, in the above formula (8) and formula (9), $\gamma$ is a coefficient of thermal expansion of the first board, $\epsilon$ is a coefficient of thermal expansion of the second board, $D_1$ is a distance from a center of gravity of the first board to the second terminal, $D_3$ is a distance from a center of gravity of the second board to the third terminal, $\theta_1$ is an angle of an imaginary line connecting from a center of gravity of the first board to the second terminal with respect to an X-axis, $\theta_3$ is an angle from a center of gravity of the second board to the third terminal with respect to the X-axis, $L_{x2}$ is a length of the second conductor part in the X-axial direction, $L_{y2}$ is a length of the second conductor part in a Y-axial direction substantially perpendicular to the X-axis, and $\Delta T$ is a temperature difference between a test temperature and a room temperature.

16. A probe comprising:
a membrane having a contact terminal which contacts an input/output terminal of the electronic device under test;
a first board having a first main surface on which a first terminal is provided and a second main surface on which a second terminal electrically connected to the first terminal is provided;
a second board which is electrically connected to the electronic device test apparatus and has a third terminal;
a first anisotropic conductivity elastic member having a first conductor part which electrically connects the contact terminal of the membrane and the first terminal of the first board; and
a second anisotropic conductivity elastic member having a second conductor part which electrically connects the second terminal of the first board and the third terminal of the second board, wherein
the second conductor parts are arranged on the whole of the second anisotropic conductivity elastic member,
the first conductor part has conductivity in only a thickness direction, and
the probe satisfies the following formula (10):

$$(\gamma-\alpha) \times \Delta T \times D_4 \leq 0.2 \times t_1 \quad (10)$$

where, in the above formula (10), $\alpha$ is a coefficient of thermal expansion of the semiconductor wafer under test, $\gamma$ is a coefficient of thermal expansion of the first board, ΔT is a temperature difference between a test temperature and a room temperature, $D_4$ is a distance from a center of gravity of the first board to the first terminal at a most distant position, and $t_1$ is a thickness of the first conductor part.

17. A probe comprising:
a membrane having a contact terminal which contacts an input/output terminal of the electronic device under test;
a first board having a first main surface on which a first terminal is provided and a second main surface on which a second terminal electrically connected to the first terminal is provided;
a second board which is electrically connected to the electronic device test apparatus and has a third terminal;
a first anisotropic conductivity elastic member having a first conductor part which electrically connects the contact terminal of the membrane and the first terminal of the first board; and
a second anisotropic conductivity elastic member having a second conductor part which electrically connects the second terminal of the first board and the third terminal of the second board, wherein
the second conductor parts are arranged on the whole of the second anisotropic conductivity elastic member,
the second conductor part has conductivity in only a thickness direction, and
the probe satisfies the following formula (11):

$$(\epsilon-\gamma) \times \Delta T \times D_5 \leq 0.2 \times t_2 \quad (11)$$

where, in the above formula (11), $\gamma$ is a coefficient of thermal expansion of the first board, $\epsilon$ is a coefficient of thermal expansion of the second board, ΔT is a temperature difference between a test temperature and a room temperature, $D_5$ is a distance from a center of gravity of the first board to the second terminal at a most distant position, and $t_2$ is a thickness of the second conductor part.

18. The probe as set forth in claim 1, wherein the second board has an electronic device which is used at the time of the test and is mounted on the surface opposite to the surface facing the second anisotropic conductivity elastic member.

19. The probe as set forth in claim 1, wherein each of the first boards is provided with two or more positioning-use first through holes.

20. The probe as set forth in claim 18, wherein
the third terminals are arranged so as to correspond to the second terminals,
the second board has positioning-use first marks arranged so as to correspond to the first through holes of the first boards, and
the first marks are formed at the same step as the third terminals.

21. The probe as set forth in claim 18, wherein the second anisotropic conductivity elastic member is provided with positioning-use second through holes so as to correspond to the first through holes of the first boards.

22. The probe as set forth in claim 18, wherein
the membrane is provided with positioning-use second marks so as to correspond to the first through holes of the first boards, and
the second marks are formed at the same step as the conductive pattern provided on the surface of the membrane facing the first anisotropic conductivity elastic member.

23. The probe as set forth in claim 18, wherein the first anisotropic conductivity elastic member is provided with positioning-use third through holes so as to correspond to the first through holes of the first boards.

24. The probe as set forth in claim 1, wherein the probe further comprises a sealing member provided between the membrane and the second board so as to cover the first anisotropic conductivity elastic member, the first boards, and the second anisotropic conductivity elastic member at the outer circumference.

25. The probe as set forth in claim 23, wherein
the sealing member has the substantially same height as the height from the membrane to the second board, and
the sealing member holds the membrane flatly.

26. An electronic device test apparatus comprising:
the probe as set forth in claim 1;
a holding device configured to hold the semiconductor wafer under test so as to face the probe;
a sealing device configured to form a sealed space between the second board of the probe and the holding device; and
a pressure reducing device configured to reduce a pressure in the sealed space, wherein
the pressure reducing device reduces pressure in the sealed space so that the contact terminals of the membrane are connected to the third terminals of the second board through the first anisotropic conductivity elastic member, the first boards, and the second anisotropic conductivity elastic member and so that the contact terminals of the membrane and the input/output terminals formed on the semiconductor wafer under test contact.

27. A method of production of the probe as set forth in claim 1,
the method of production of the probe comprising:
aligning second through holes provided in the second anisotropic conductivity elastic member with first marks provided on the second board so as to position the second anisotropic conductivity elastic member with respect to the second board;
stacking the second anisotropic conductivity elastic member on the second board;
aligning first through holes provided in the first board with the first marks so as to position the first boards with respect to the second board; and
stacking the first boards on the second anisotropic conductivity elastic member.

28. A method of production of the probe as set forth in claim 1,
the method of production of the probe comprising:
aligning third through holes provided in the first anisotropic conductivity elastic member with second marks provided on the membrane so as to position the first anisotropic conductivity elastic member with respect to the membrane;
stacking the first anisotropic conductivity elastic member on the membrane;
aligning first through hole holes provided in the first board boards with the second marks so as to position the first boards with respect to the membrane; and
stacking the first boards on the first anisotropic conductivity elastic member.

* * * * *

UNITED STATES PATENT AND TRADEMARK OFFICE
CERTIFICATE OF CORRECTION

PATENT NO.        : 8,598,902 B2
APPLICATION NO.   : 12/994579
DATED             : December 3, 2013
INVENTOR(S)       : Y. Umemura et al.

Page 1 of 1

It is certified that error appears in the above-identified patent and that said Letters Patent is hereby corrected as shown below:

In the Claims

Column 24, line 57 (claim 28, line 11), please change "first through hole holes" to --first through holes--

Column 24, lines 57 and 58 (claim 28, lines 11 and 12) please change "the first board boards" to --the first boards--

Signed and Sealed this
Twenty-ninth Day of July, 2014

Michelle K. Lee
*Deputy Director of the United States Patent and Trademark Office*